United States Patent
Aoyama

(10) Patent No.: US 9,659,957 B2
(45) Date of Patent: May 23, 2017

(54) SEMICONDUCTOR MEMORY DEVICE AND METHOD FOR MANUFACTURING SAME

(71) Applicant: Kabushiki Kaisha Toshiba, Minato-ku (JP)

(72) Inventor: Kenji Aoyama, Yokkaichi (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 15/046,611

(22) Filed: Feb. 18, 2016

(65) Prior Publication Data

US 2017/0062464 A1 Mar. 2, 2017

Related U.S. Application Data

(60) Provisional application No. 62/210,021, filed on Aug. 26, 2015.

(51) Int. Cl.
*H01L 27/11582* (2017.01)
*H01L 27/1157* (2017.01)

(52) U.S. Cl.
CPC .... *H01L 27/11582* (2013.01); *H01L 27/1157* (2013.01)

(58) Field of Classification Search
CPC .................. H01L 27/11582; H01L 27/1157
See application file for complete search history.

(56) References Cited

U.S. PATENT DOCUMENTS

| 7,847,334 | B2 | 12/2010 | Katsumata et al. |
| 8,053,829 | B2 * | 11/2011 | Kang .................... H01L 27/115 257/324 |
| 8,723,247 | B2 | 5/2014 | Komori et al. |
| 2009/0180324 | A1 * | 7/2009 | Ramaswamy ...... H01L 21/8239 365/185.17 |

* cited by examiner

*Primary Examiner* — Karen Kusumakar
(74) *Attorney, Agent, or Firm* — Oblon, McClelland, Maier & Neustadt, L.L.P.

(57) ABSTRACT

According to one embodiment, a semiconductor memory device includes a first stacked body including a plurality of first electrode layers and a plurality of first insulating layers, the first electrode layers separately stacked each other, the first insulating layers provided between the first electrode layers; a second stacked body including a plurality of second electrode layers and a plurality of second insulating layers, the second electrode layers separately stacked each other, the second insulating layers provided between the second electrode layers, the second stacked body separated from the first stacked body in a first direction crossing a stacking direction of the first stacked body; and a first insulating portion provided between the first stacked body and the second stacked body, the first insulating portion provided integrally to the first insulating layers and the second insulating layers.

20 Claims, 15 Drawing Sheets

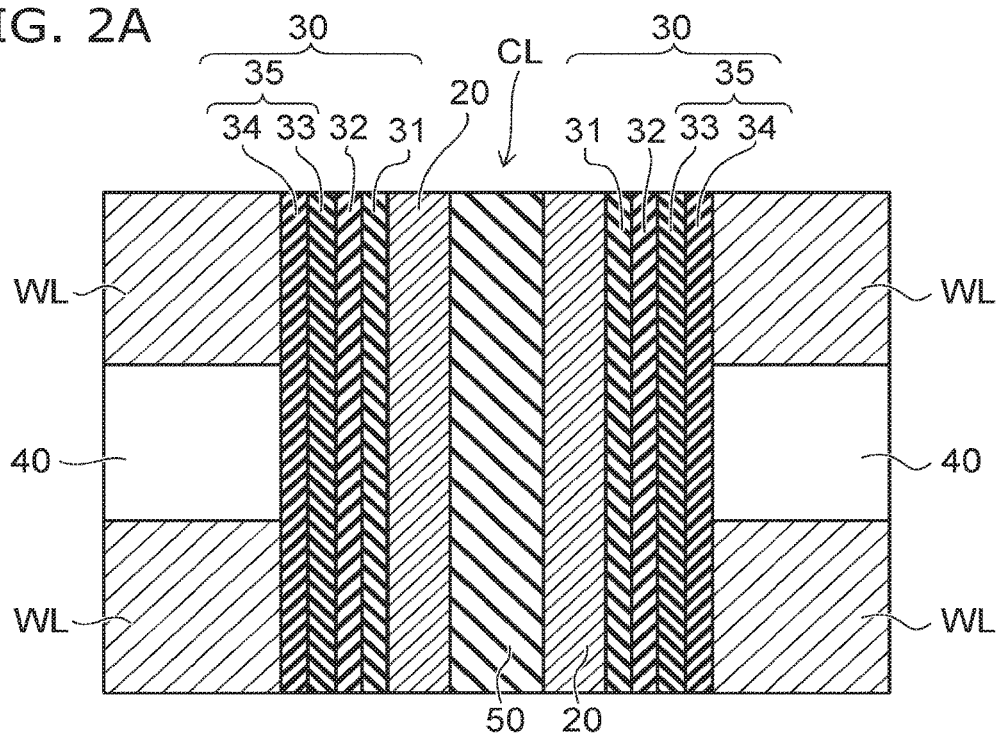
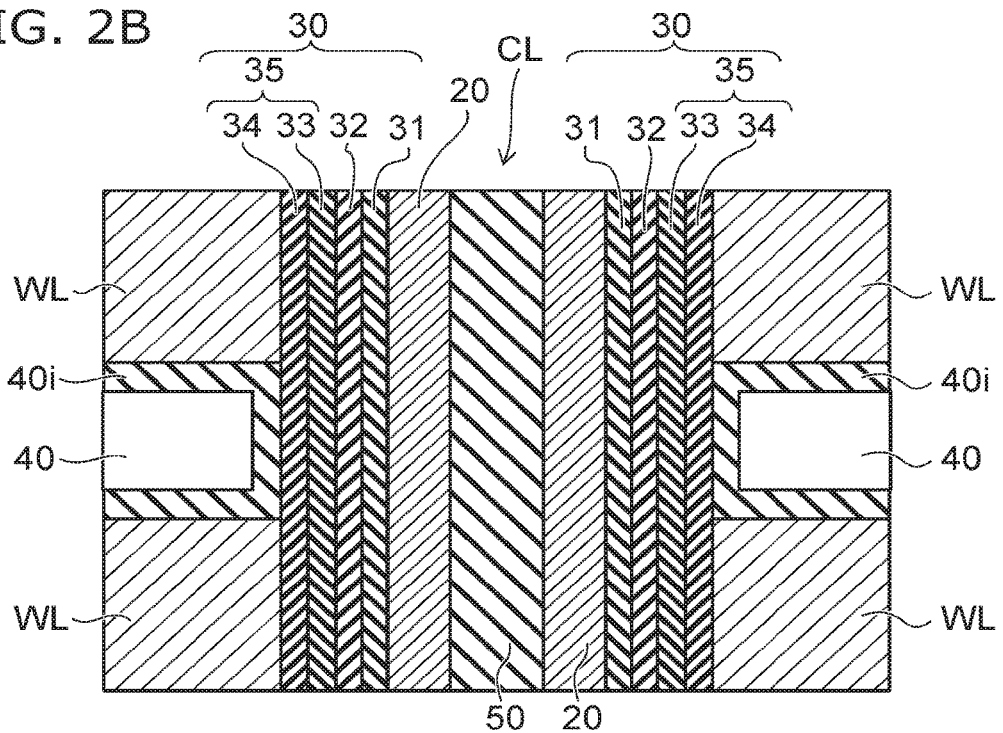

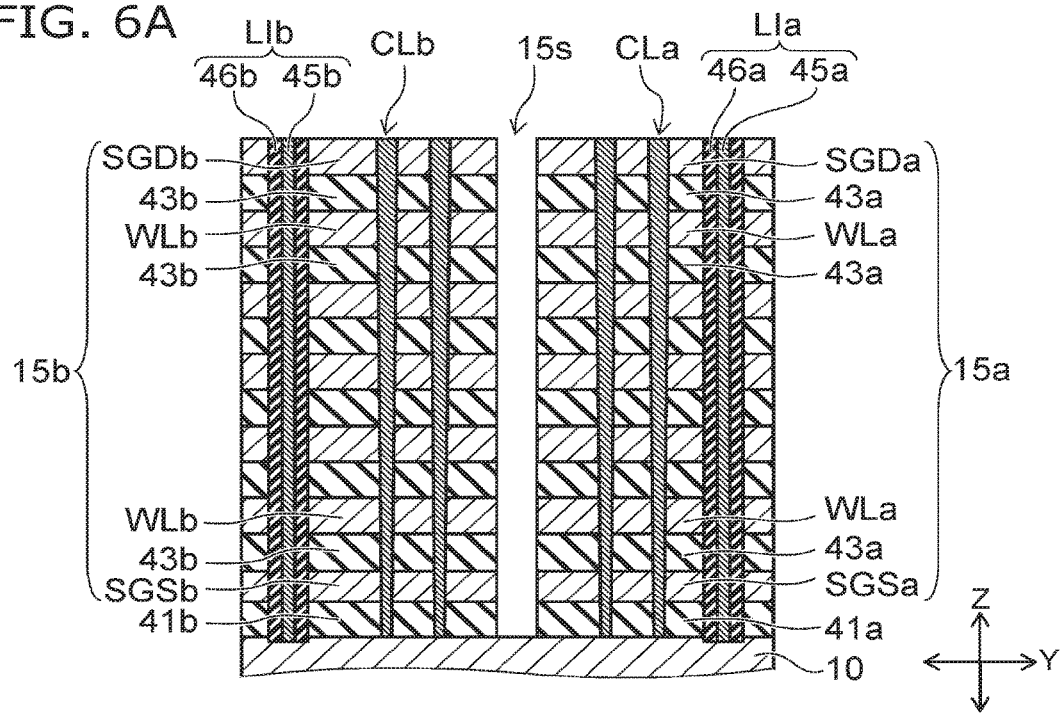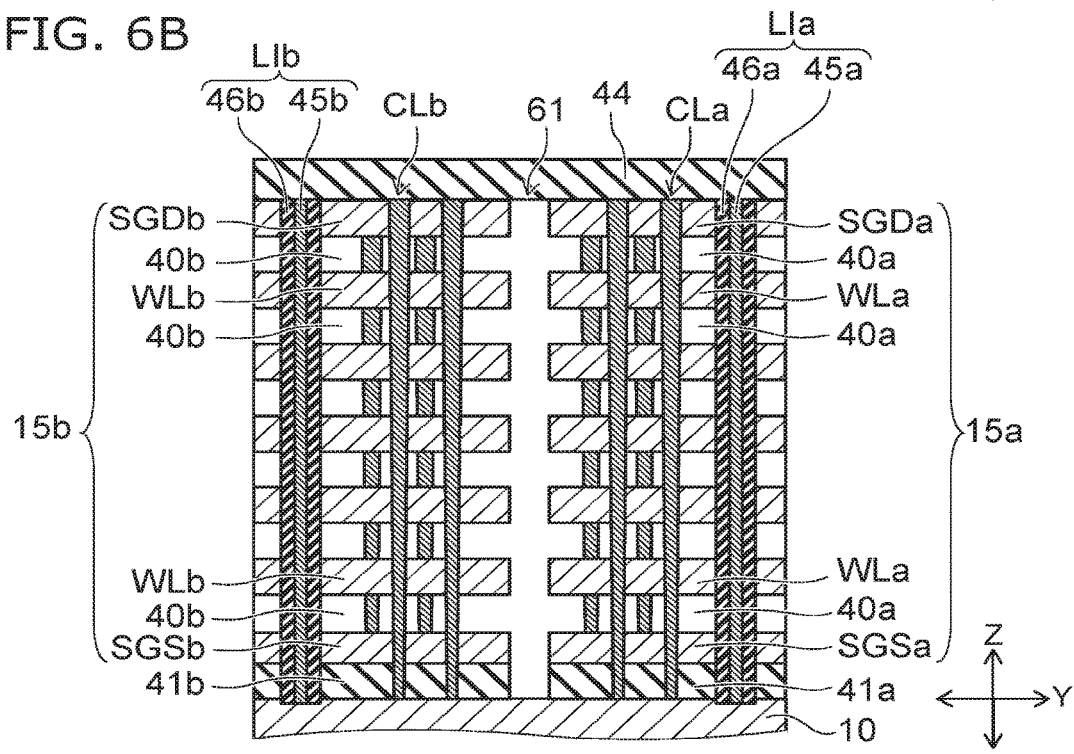

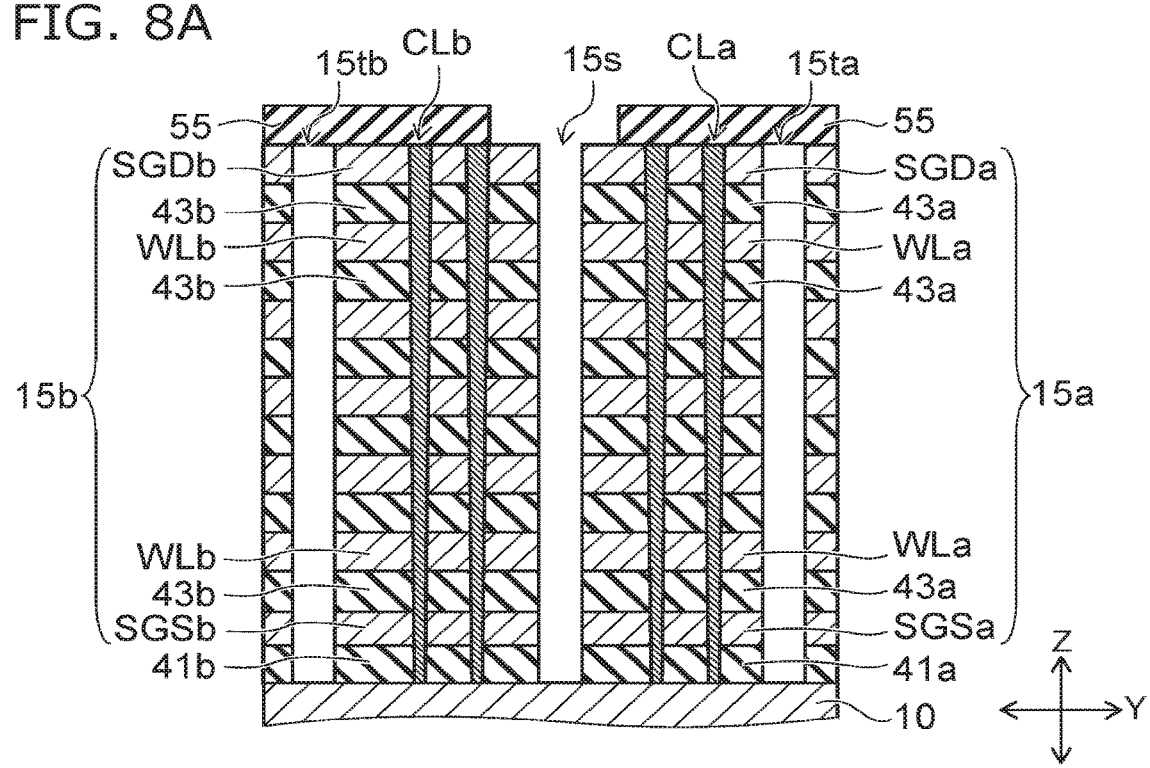
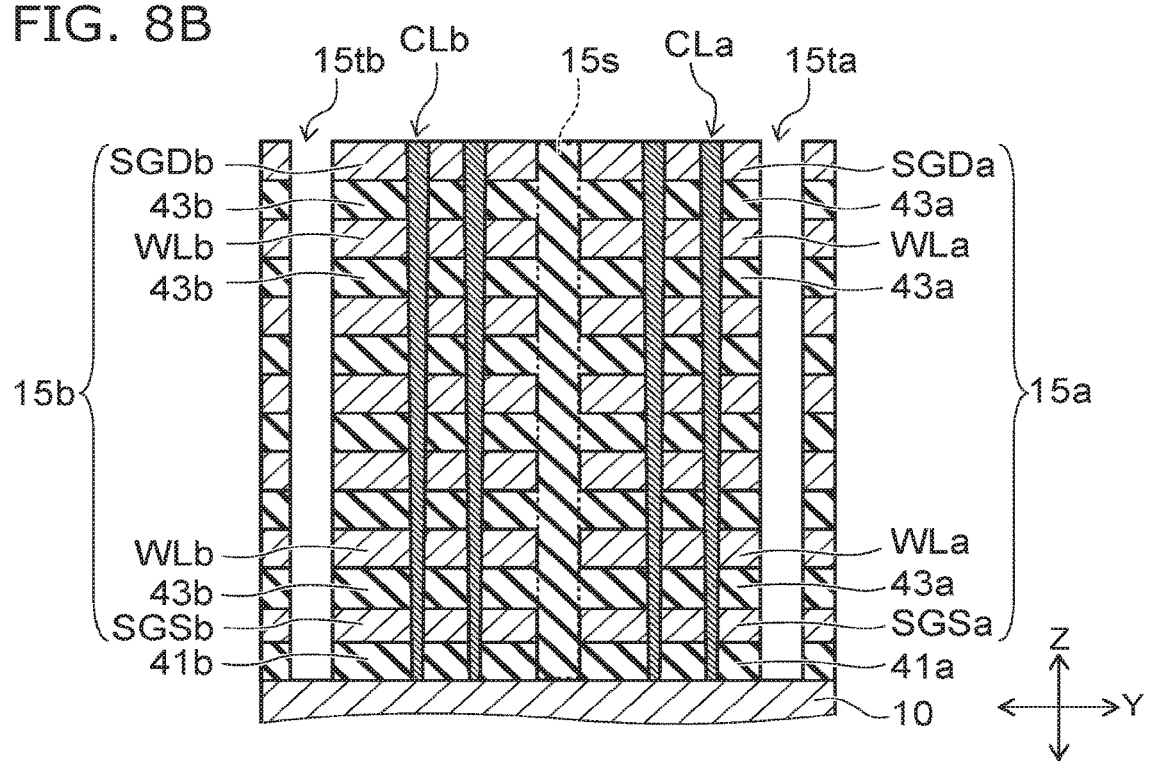

SEMICONDUCTOR MEMORY DEVICE AND METHOD FOR MANUFACTURING SAME

CROSS-REFERENCE TO RELATED APPLICATIONS

This application is based upon and claims the benefit of priority from U.S. Provisional Patent Application 62/210,021 filed on Aug. 26, 2015; the entire contents of which are incorporated herein by reference.

FIELD

Embodiments described herein relate generally to a semiconductor memory device and a method for manufacturing same.

BACKGROUND

There is a stacked semiconductor memory device including memory cells that are three-dimensionally disposed for increasing the degree of integration of memory. The semiconductor memory device includes a plurality of channel bodies extending in a stacking direction and a plurality of electrode layers that extend in a direction intersecting the stacking direction and are arranged in the stacking direction. A plurality of memory cells are formed between the channel bodies and the electrode layers.

BRIEF DESCRIPTION OF THE DRAWINGS

FIG. 2A and FIG. 2B are enlarged schematic cross-sectional views of a part of the columnar portion of the embodiment;

FIG. 4A to FIG. 6B are schematic cross-sectional views showing a method for manufacturing the semiconductor memory device of the embodiment;

FIG. 7A to FIG. 9B are schematic cross-sectional views showing another method for manufacturing the semiconductor memory device of the embodiment;

DETAILED DESCRIPTION

Figure 1:
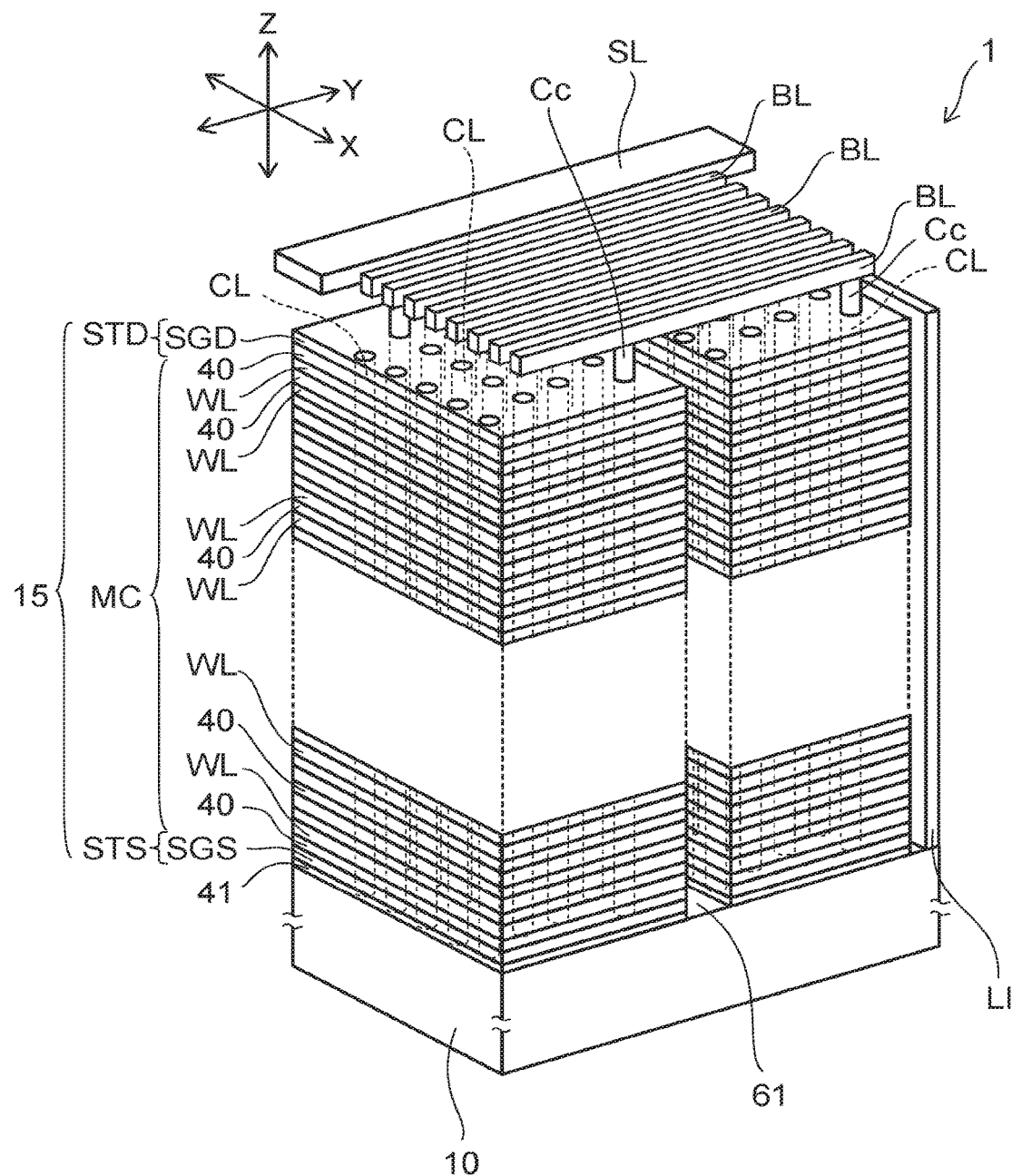
FIG. 1 is a schematic perspective view of a memory cell array of an embodiment.

According to one embodiment, a semiconductor memory device includes a first stacked body including a plurality of first electrode layers and a plurality of first insulating layers, the first electrode layers separately stacked each other, the first insulating layers provided between the first electrode layers; a second stacked body including a plurality of second electrode layers and a plurality of second insulating layers, the second electrode layers separately stacked each other, the second insulating layers provided between the second electrode layers, the second stacked body separated from the first stacked body in a first direction crossing a stacking direction of the first stacked body; and a first insulating portion provided between the first stacked body and the second stacked body, the first insulating portion provided integrally to the first insulating layers and the second insulating layers.

Hereinafter, embodiments will be described with reference to the drawings. In the drawings, the same elements are denoted by the same reference sign.

An example of a configuration of a memory cell array 1 according to the embodiment will be described with reference to FIG. 1.

FIG. 1 is a schematic perspective view of the memory cell array 1 according to the embodiment. It should be noted that in FIG. 1, in order to make the drawing eye-friendly, the graphical descriptions of insulating layers between electrode layers, and so on are omitted.

In FIG. 1, two directions perpendicular to each other are defined as an X-direction (a second direction) and a Y-direction (a first direction), respectively, and a direction, which is perpendicular to the X-direction and the Y-direction (an X-Y plane), and in which a plurality of electrode layers WL is stacked, is defined as a Z-direction (a stacking direction).

As shown in FIG. 1, the memory cell array 1 includes a substrate 10 (conductive layer), stacked structures 15, a plurality of columnar portions CL, a interconnect portion LI, and upper layer interconnect. FIG. 1 shows bit lines BL and a source layer SL as the upper layer interconnect.

The stacked structures 15 are provided on the substrate 10 via an insulating layer 41. The stacked structures 15 each include a source-side select gate SGS, a drain-side select gate SGD, the plurality of electrode layers WL, and a plurality of insulating layers 40.

The source-side select gate SGS is provided as the lowermost layer of the stacked structure 15. The drain-side select gate SGD is provided as the uppermost layer of the stacked structure 15.

The electrode layers WL are separately stacked each other. The insulating layers 40 are provided between the electrode layers WL. The insulating layers 40 have, for example, an air gap. It should be noted that the number of the layers of the electrode layers WL shown in the drawing is illustrative only, and the number of the layers of the electrode layers WL is arbitrary.

The electrode layers WL each include metal. The electrode layers WL each include at least one of, for example, tungsten, molybdenum, titanium nitride, and tungsten nitride, and can also include silicon or metal silicide. The source-side select gate SGS and the drain-side select gate SGD each include the same material as those of the electrode layers WL.

The thickness of the drain-side select gate SGD and the thickness of the source-side select gate SGS are larger than the thickness of, for example, one electrode layer WL, and a plurality of such layers can also be provided. It should be noted that the thickness of the drain-side select gate SGD and the thickness of the source-side select gate SGS can also be equal to or smaller than the thickness of one electrode layer WL, and in such a case, a plurality of such layers can also be provided similarly to the case described above. It should be noted that the "thickness" here represents the thickness in the stacking direction (the Z-direction) of the stacked structure 15.

The columnar portions CL are provided in the stacked structure 15 and extend in the Z-direction. The columnar portions CL each provided so as to have, for example, a circular cylindrical shape or an elliptic cylindrical shape. The plurality of columnar portions CL is provided to form, for example, a staggered arrangement. Alternatively, the columnar portions CL can also be provided to form a square lattice along the X-direction and the Y-direction. The columnar portions CL are electrically connected to the substrate 10.

The columnar portions CL each have a channel body 20, a memory film 30, and a core insulating film 50 shown in FIG. 2A. The memory film 30 is provided between the stacked structure 15 and the channel body 20. The memory film 30 and the channel body 20 extend in the Z-direction.

The core insulating film 50 is provided inside the channel body 20. It should be noted that the channel body 20 can also have, for example, a columnar shape. Inside the channel body 20, it is not necessary to provide, for example, the core insulating film 50.

The channel body 20 is a silicon film having, for example, silicon as a principal component. The core insulating film 50 includes, for example, a silicon oxide film, and can also include an air gap.

The interconnect portion LI is provided in the stacked structure 15 and extends in the X-direction and the Z-direction inside the stacked structure 15. The interconnect portion LI is sandwiched by the stacked structures 15. The interconnect portion LI includes insulating films 46 and a conductive film 45 shown in FIG. 3.

The insulating films 46 are provided on sidewalls of the interconnect portion LI. The conductive film 45 is provided on the inner side of the insulating films 46. The insulating films 46 and the conductive film 45 extend in the X-direction and the Z-direction.

A lower end of the conductive film 45 can electrically be connected to the channel body 20 (a semiconductor film) in each of the columnar portions CL via a transistor Tr formed in the substrate 10. For example, the transistor Tr in the substrate 10 uses the source-side select gate SGS as the gate electrode, and uses the substrate 10 as the channel. Thus, when setting the transistor Tr to the ON state, the conductive film 45 is electrically connected to the channel body 20.

Figure 3:
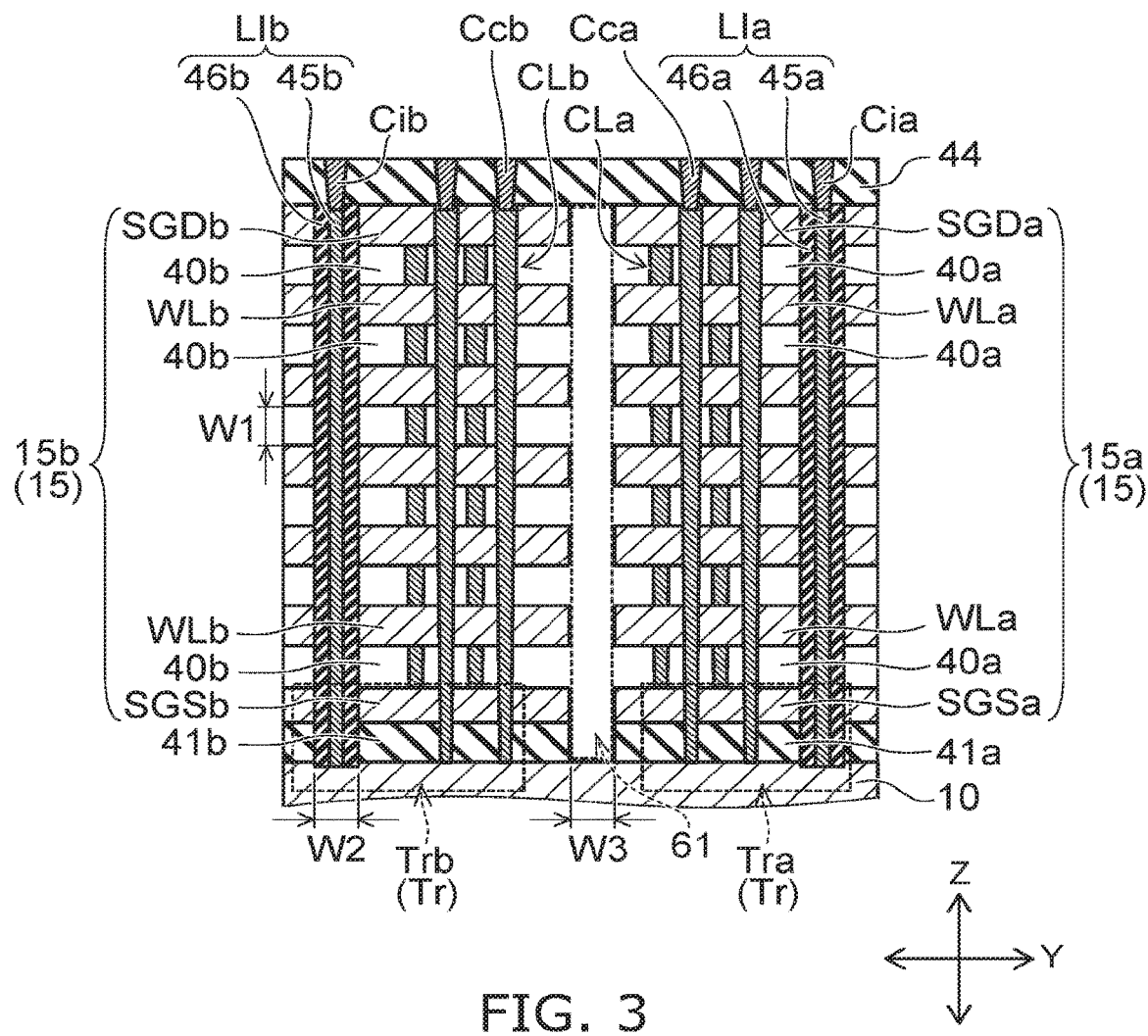
FIG. 3 is a schematic cross-sectional view of a part of the memory cell array of the embodiment.

The conductive film 45 is electrically connected to a control circuit not shown via a contact portion Ci and the source layer SL shown in FIG. 3 in an area above the conductive film 45.

The plurality of bit lines BL (e.g., metal films) is provided on the stacked structures 15. The bit lines BL are separated from each other in the X-direction, and each extend in the Y-direction.

An upper end of each of the channel bodies 20 is connected to the bit line BL (the interconnect), and a lower end side of the channel bodies 20 is connected to the substrate 10.

The channel body 20 of one of the columnar portions CL selected from one of regions separated in the Y-direction and the channel body 20 of one of the columnar portions CL selected from the other of the regions are connected to common one of the bit lines BL.

The upper end portions of the columnar portions CL are each provided with a drain-side select transistor STD, and the lower end portions are each provided with a source-side select transistor STS.

A memory cell MC, the drain-side select transistor STD, and the source-side select transistor STS are each a vertical transistor through which a current flows in the stacking direction (the Z-direction) of the stacked structure 15.

The select gates SGD, SGS function as gate electrodes of the respective select transistors STD, STS, namely as select gates. An insulating film is provided between each of the select gates SGD, SGS and the channel body 20, the insulating film functioning as the gate insulating film of each of the select transistors STD, STS.

A plurality of memory cells MC is provided between the drain-side select transistor STD and the source-side select transistor STS, the plurality of memory cells MC has the electrode layers WL of the respective layers as control gates.

The plurality of memory cells MC, the drain-side select transistor STD, and the source-side select transistor STS are connected in series to each other via the channel body 20 to configure one memory string. The memory strings are provided in directions of a plane parallel to the X-Y plane to form, for example, a staggered arrangement, and thus, the memory cells MC are three-dimensionally provided in the X-direction, Y-direction, and the Z-direction.

The semiconductor memory device according to the embodiment is capable of electrically and freely performing data erasure and data writing, and holding the storage contents even if the power is cut.

An example of the memory cell MC according to the embodiment will be described with reference to FIG. 2A. FIG. 2A is an enlarged cross-sectional view of a part of the columnar portion CL of the embodiment.

The memory cell MC is of, for example, a charge-trap type, and has the electrode layer WL, the memory film 30, the channel body 20, and the core insulating film 50.

The channel body 20 functions as the channel in the memory cell MC, and the electrode layer WL functions as the control gate of the memory cell MC. A charge storage film 32 functions as a data storage layer for storing the charge injected from the channel body 20. In other words, the memory cells MC each having a structure of surrounding the periphery of the channel with the control gate are formed at the respective intersections between the channel body 20 and the electrode layers WL.

The memory film 30 includes, for example, a block insulating film 35, the charge storage film 32, and a tunnel insulating film 31. The block insulating film 35 includes contact with the electrode layers WL, the tunnel insulating film 31 is in contact with the channel body 20, and the charge storage film 32 is provided between the block insulating film 35 and the tunnel insulating film 31.

The block insulating film 35 prevents the charge stored in the charge storage film 32 from being diffused to the electrode layers WL. The block insulating film 35 contains, for example, at least any one of hafnium, aluminum, zirconium, and lanthanum, and contains a material (a high dielectric constant oxide film: High-k film) having a higher dielectric constant than a silicon nitride film.

The block insulating film 35 includes, for example, a cap film 34 and a block film 33. The block film 33 is provided between the cap film 34 and the charge storage film 32. The block film 33 is, for example, a silicon oxide film.

The cap film 34 is provided in contact with the electrode layers WL. The cap film 34 uses a film having a higher dielectric constant than the block film 33, and contains, for example, at least any one of hafnium, aluminum, zirconium, and lanthanum described above. The cap film 34 includes, for example, at least either one of a silicon nitride film and aluminum oxide film. By providing the cap film 34 so as to have contact with the electrode layers WL, it is possible to suppress the back tunnel electrons injected from the electrode layers WL in the erasure operation. In other words, by using a stacked film formed of a silicon oxide film and either of the silicon nitride film and the high dielectric oxide film as the block insulating film 35, the charge blocking property can be enhanced.

The charge storage film 32 has a number of trap sites for capturing the charge, and includes at least either of, for example, a silicon nitride film and hafnium oxide.

The tunnel insulating film 31 acts as a potential barrier when the charge is injected from the channel body 20 to the charge storage film 32, or when the charge stored in the charge storage film 32 is diffused in the channel body 20. The tunnel insulating film 31 is, for example, a silicon oxide film.

Alternatively, it is also possible to use a stacked film (ONO film) having a structure of sandwiching a silicon nitride film with a pair of silicon oxide films as the tunnel insulating film 31. By using the ONO film as the tunnel insulating film 31, the erasure operation can be performed in a lower electric field compared to the case of a single layer of the silicon oxide film.

It should be noted that as shown in, for example, FIG. 2B, it is also possible for the insulating layer 40 to include an insulating film 40i having contact with the electrode layers WL and the block insulating film 35.

An example of a configuration of the inside of the stacked structure 15 of the embodiment will be described with reference to FIG. 3.

FIG. 3 is a schematic cross-sectional view of a part of the memory cell array 1 according to the embodiment. It should be noted that in FIG. 3, graphical description of the structure on and above an insulating layer 44 is omitted.

As shown in FIG. 3, the stacked structure 15 includes a first stacked body 15a and a second stacked body 15b. The second stacked body 15b is separated from the first stacked body 15a in the Y-direction via an insulating portion 61. The first stacked body 15a includes a plurality of first electrode layers WLa. The second stacked body 15b includes a plurality of second electrodes WLb, the number of stacked layers of the second electrode layers WLb is same as the number of stacked layers of the first electrode layers WLa of the first stacked body 15a.

The insulating portion 61 extends in the Z-direction and the X-direction. The insulating portion 61 is in contact with side surfaces of the electrode layers WL, a side surface of the source-side select gate SGS and a side surface of the drain-side select gate SGD. The insulating portion 61 is provided integrally with the insulating layers 40 provided between the respective electrode layers WL. The insulating layers 40 have contact with a side surface of the insulating film 46, and are separated in the Y-direction across the interconnect portion LI.

The insulating portion 61 and the insulating layers 40 each have, for example, an air gap. Specifically, in the case in which, for example, the whole of the insulating portion 61 and the insulating layers 40 is the air gap, the side surfaces of the electrode layers WLa, WLb are exposed to the insulating portion 61. Further, upper surfaces and lower surfaces of the electrode layers WLa, WLb are exposed to the respective insulating layers 40.

The dielectric constant of the insulating portion 61 and the dielectric constant of the insulating layers 40 are lower than, for example, the dielectric constant of the charge storage film 32. It is more preferable for the dielectric constant of the insulating portion 61 and the dielectric constant of the insulating layers 40 to be lower than, for example, the dielectric constant of a silicon oxide film.

The insulating portion 61 has a maximum width W3 in the bottom surface in the Y-direction. The width W3 is, for example, not less than a maximum thickness W1 of the insulating layers 40 in the stacking direction, or can also be approximately the equal width.

It should be noted that insulating layers 41a, 41b provided below the respective stacked bodies 15a, 15b can also be provided integrally, for example. In other words, it is not necessarily required for the insulating layer 41 to be separated by the stacked body.

The insulating layer 44 is integrally provided on the first stacked body 15a, the second stacked body 15b, and the insulating portion 61.

It should be noted that elements, which are included in the respective stacked bodies 15a, 15b, and are the same except the location, are denoted by the symbols added with "a" or "b" at the end thereof. Further, in the case in which the symbols are not added with "a" or "b," the symbols denote the respective elements of the stacked bodies 15a, 15b, and in the case in which the description overlaps the content having been described above, the description will be omitted.

The stacked bodies 15a, 15b each include the plurality of electrode layers WL, the plurality of insulating layers 40, the source-side select gate SGS, and the drain-side select gate SGD.

The interconnect portions LIa, LIb are respectively provided on the side surfaces of the respective stacked bodies 15a, 15b in the Y-direction. The interconnect portion LIa is provided farther from the insulating portion 61 than the first stacked body 15a, and the interconnect portion LIb is provided farther from the insulating portion 61 than the second stacked body 15b. In other words, in the Y-direction, the interconnect portion LIa, the first stacked body 15a, the insulating portion 61, the second stacked body 15b, and the interconnect portion LIb are provided in sequence.

The columnar portion CL is provided in each of the stacked bodies 15a, 15b. The columnar portions CL in the respective stacked bodies 15a, 15b are provided between the interconnect portion LIa and the interconnect portion LIb. More specifically, a columnar portion CLa is provided between the interconnect portion LIa and the insulating portion 61, and a columnar portion CLb is provided between the insulating portion 61 and the interconnect portion LIb. The distance between one of the columnar portions CLa, CLb and the insulating portion 61 is shorter than the distance between one of the interconnect portions LIa, LIb and the insulating portion 61.

An upper end of the columnar portion CL is electrically connected to the bit line BL shown in FIG. 1 via a contact portion Cc. A lower end of the columnar portion CL is electrically connected to the conductive film 45 via the substrate 10. Specifically, a conductive film 45a is electrically connected to the channel body 20 via a first transistor Tr1 provided in the substrate 10, and a conductive film 45b is electrically connected to the channel body 20 via a second transistor Tr2 provided in the substrate 10.

The interconnect portions LIa, LIb each have a maximum width W2 in the bottom surface in the Y-direction. The width W2 is, for example, not less than the width W3, or can also be approximately the equal width.

An example of a method of manufacturing the semiconductor memory device according to the embodiment will be described with reference to FIG. 4A to FIG. 6B.

Figure 4A:
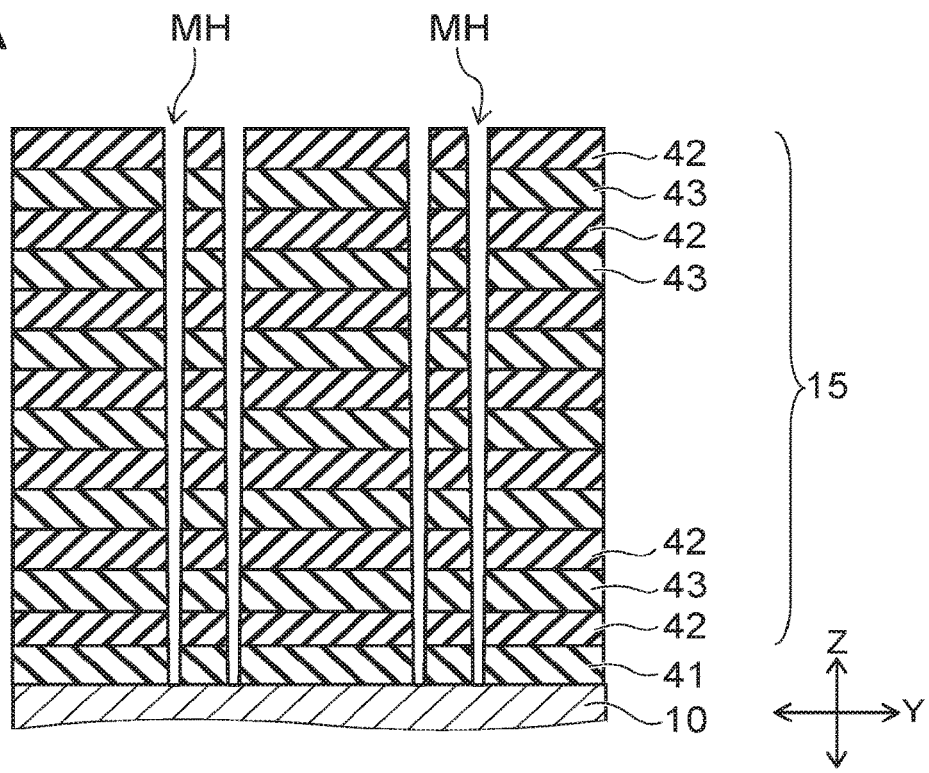

As shown in FIG. 4A, on the substrate 10, the stacked structure 15 including a plurality of first layers 42 and a plurality of second layers 43 is formed via the insulating layer 41. The first layers 42 are separately stacked each other. The second layers 43 are each formed between the first layers 42.

As the first layers 42 and the second layers 43, there is used, for example, a combination of materials having respective etching rates different from each other. As the combination of the first layers 42 and the second layers 43, there can be cited, for example, a combination of a silicon nitride film and undoped silicon, a combination of a silicon nitride film and a silicon oxide film, and a combination of a silicon oxide film and undoped silicon.

Subsequently, a plurality of holes MH piercing the stacked structure 15 and reaching the substrate 10 is formed.

Figure 4B:
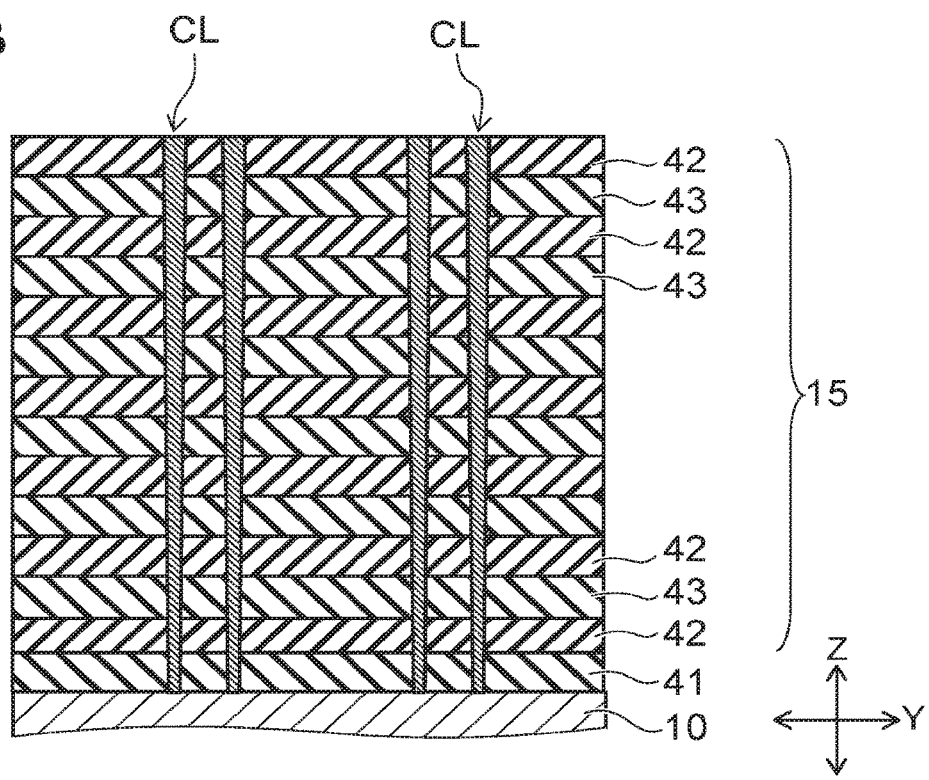

As shown in FIG. 4B, the films (the channel body 20, the memory film 30, and so on) shown in FIG. 2A are formed in each of the holes MH. Thus, the columnar portions CL are formed. The channel body 20 in each of the columnar portions CL can electrically be connected to the substrate 10.

Figure 5A:
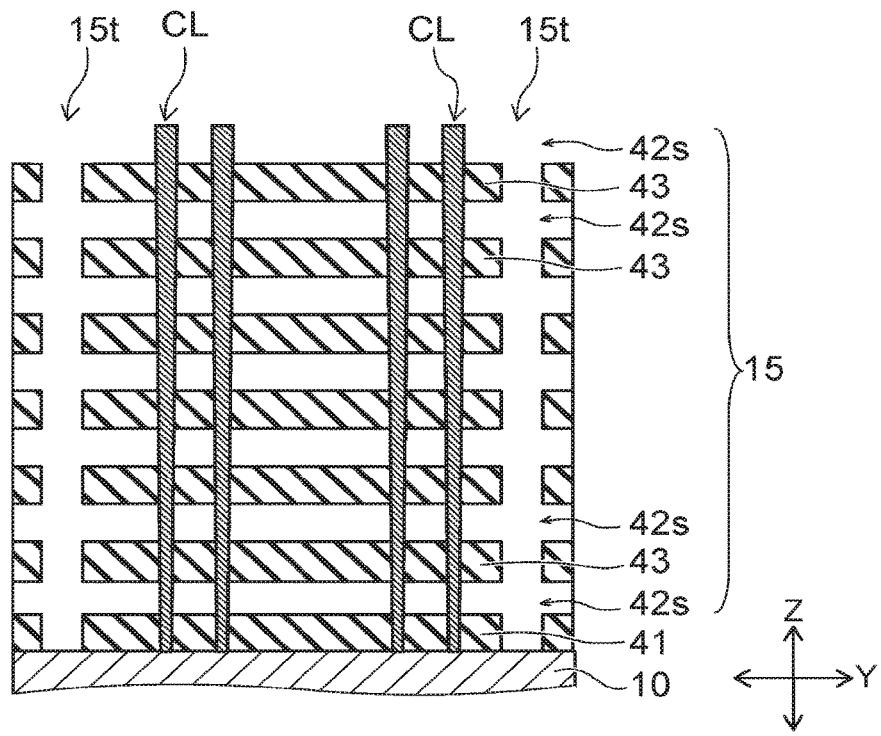

As shown in FIG. 5A, slits 15t piercing the stacked structure 15 and reaching the substrate 10 are formed. The slits 15t each extend in the X-direction.

Subsequently, the first layers 42 are removed through the slits 15t. For example, in the case in which the first layers 42 are silicon nitride films, the first layers 42 are removed using a heated phosphoric acid aqueous solution (hot phosphoric acid). Thus, a space 42s is formed in the part from which the first layers 42 are removed.

Figure 5B:
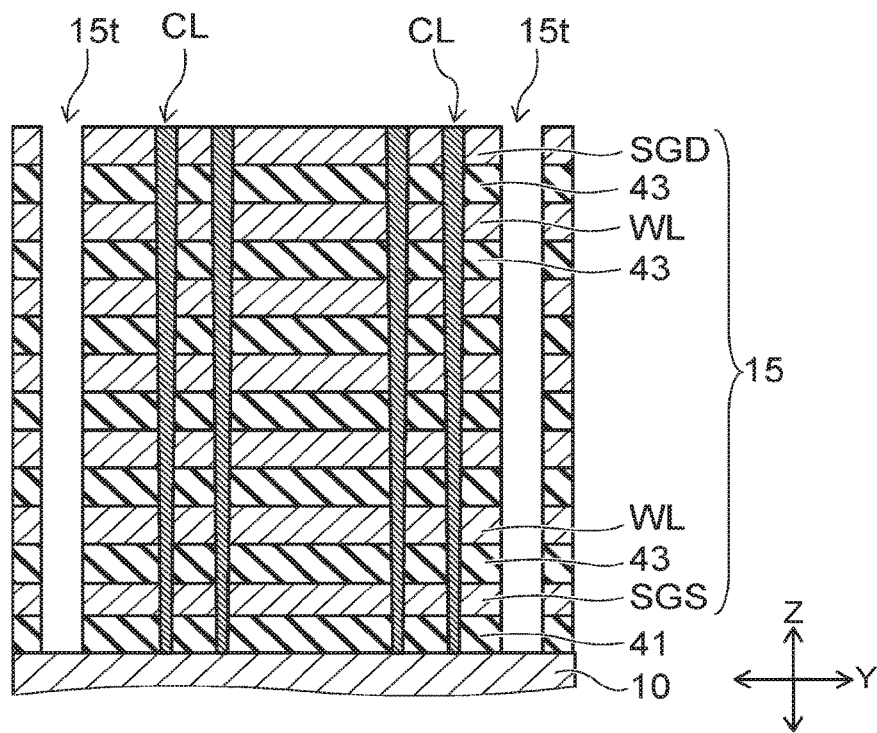

As shown in FIG. 5B, the electrode layers WL, the source-side select gate SGS, and the drain-side select gate SGD are formed in the space 42s. The source-side select gate SGS is formed in the lowermost layer of the stacked structure 15, and the drain-side select gate SGD is formed in the uppermost layer of the stacked structure 15.

As shown in FIG. 6A, the insulating films 46 are formed on sidewalls of the slit 15t. The conductive film 45 is formed on the inner side of the insulating films 46. Thus, the interconnect portion LI is formed.

Subsequently, a slit 15s piercing the stacked structure 15 and reaching the substrate 10 is formed. The slit 15s extends in the X-direction. Thus, the stacked structure 15 is provided with the first stacked body 15a and the second stacked body 15b separated in the Y-direction from each other.

In the Y-direction, the slits 15s are formed at, for example, regular intervals and alternately with the interconnect portions LI. Each of the stacked bodies 15a, 15b is formed between the slit 15s and the interconnect portion LI.

For example, in the Y-direction, the intervals at which the slits 15s are formed are each twice as large as the distance between the columnar portion CLa in the first stacked body 15a and the columnar portion CLb in the second stacked body 15b.

The slit 15s is formed between the interconnect portions LIa, LIb, and between the columnar portions CLa, CLb. The width of the slit 15s in the Y-direction is, for example, not more than the width of the interconnect portion LI, and can also be approximately the equal width.

As shown in FIG. 6B, the second layers 43 are removed through the slit 15s. For example, in the case in which the second layers 43 are each formed of undoped silicon, the second layers 43 are removed using a choline aqueous solution (trymethyl-2-hydroxyethyl ammonium hydroxide aqueous solution). Thus, a space formed integrally with the slit 15s is formed.

Subsequently, the insulating layer 44 poor in coverage is formed on the stacked bodies 15a, 15b and the slit 15s. Thus, the upper part of the slit 15s is blocked by the insulating layer 44 in the state in which an air gap is provided in the slit 15s. Thus, the insulating portions 61, 40a, and 40b are formed integrally.

Subsequently, by forming the contact portions Cc, Ci respectively on the columnar portions CL and the interconnect portions LI as shown in FIG. 3, and then forming the upper part interconnect and so on, the semiconductor memory device according to the embodiment is formed.

It should be noted that it is also possible to use the same material as that of the electrode layers WL as the material of the first layers 42 described above. In this case, the process of removing the first layers 42 is not performed. Further, it is also possible to form the insulating layer 44 on sidewalls of the slit 15s and sidewalls of the space before blocking the upper part of the slit 15s using the insulating layer 44. In this case, there are formed the insulating layers 40 each having the insulating film having contact with the electrode layers WL and the block insulating film 35 as shown in FIG. 2B.

Further, it is also possible to form the block insulating film 35 in the parts from which the first layers 42 are removed. In this case, the electrode layer WL is formed on the inner side of the block insulating film 35.

An example of another method of manufacturing the semiconductor memory device according to the embodiment will be described with reference to FIG. 7A to FIG. 9B. It should be noted that regarding the content substantially the same as that of the example of the manufacturing method described above, the description will partially be omitted.

Similarly to the example of the manufacturing method shown in FIG. 4A and FIG. 4B described above, on the substrate 10, the stacked structure 15 including the plurality of first layers 42 and the plurality of second layers 43 is formed via the insulating layer 41. The first layers 42 are separately stacked each other. The second layers 43 are each formed between the first layers 42. Subsequently, the plurality of holes MH piercing the stacked structure 15 and reaching the substrate 10 are formed.

Then, the films (the channel body 20, the memory film 30, and so on) shown in FIG. 2A are formed in each of the holes MH. Thus, the columnar portions CL are formed. The channel body 20 in each of the columnar portions CL is electrically connected to the substrate 10.

Figure 7A:
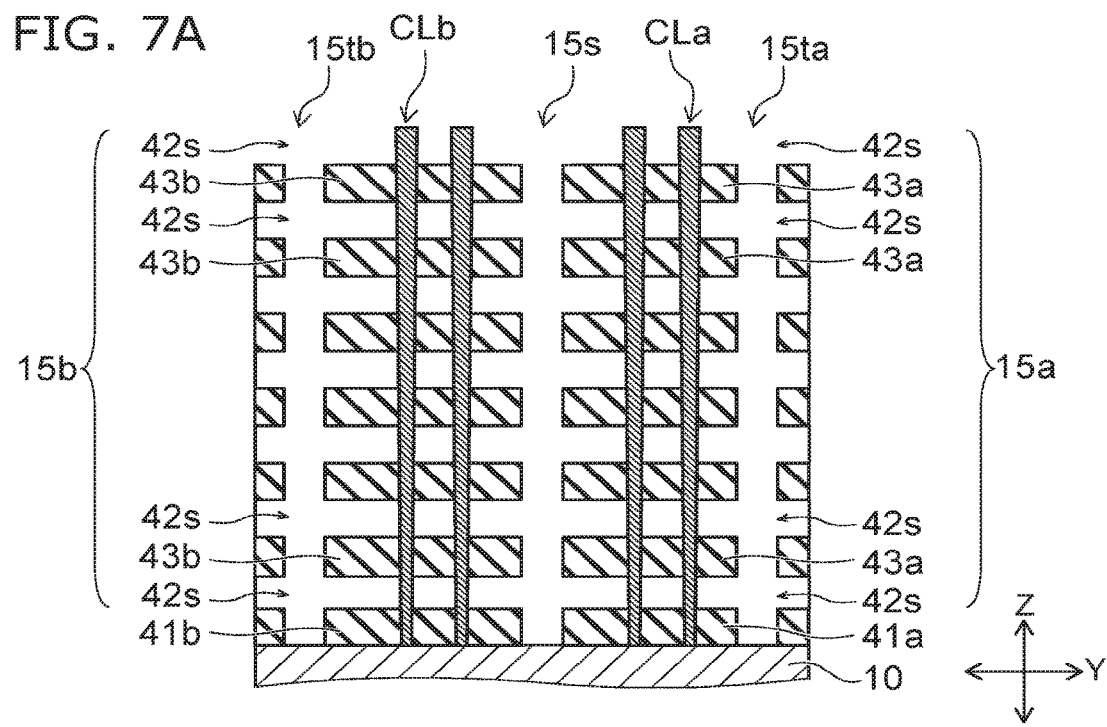

As shown in FIG. 7A, slits 15s, 15ta, and 15tb each piercing the stacked structure 15 and reaching the substrate 10 are formed. The slits 15s, 15ta, and 15tb each extend in the X-direction. Thus, the stacked structure 15 is provided with the first stacked body 15a and the second stacked body 15b separated in the Y-direction from each other. The slit 15s is formed between the slits 15ta, 15tb. In other words, the slit 15s is formed between the columnar portions CLa, CLb.

In the Y-direction, the slits 15s, 15ta, and 15tb are formed, for example, at regular intervals. For example, in the Y-direction, the intervals at which the slits 15s, 15ta, and 15tb are formed are each equal to the distance between the columnar portion CLa in the first stacked body 15a and the columnar portion CLb in the second stacked body 15b. On this occasion, the width of the slit 15s can also be different from, for example, the width of each of the slits 15ta, 15tb.

Subsequently, the first layers 42 are removed through the slits 15s, 15ta, and 15tb to form the space 42s.

Figure 7B:
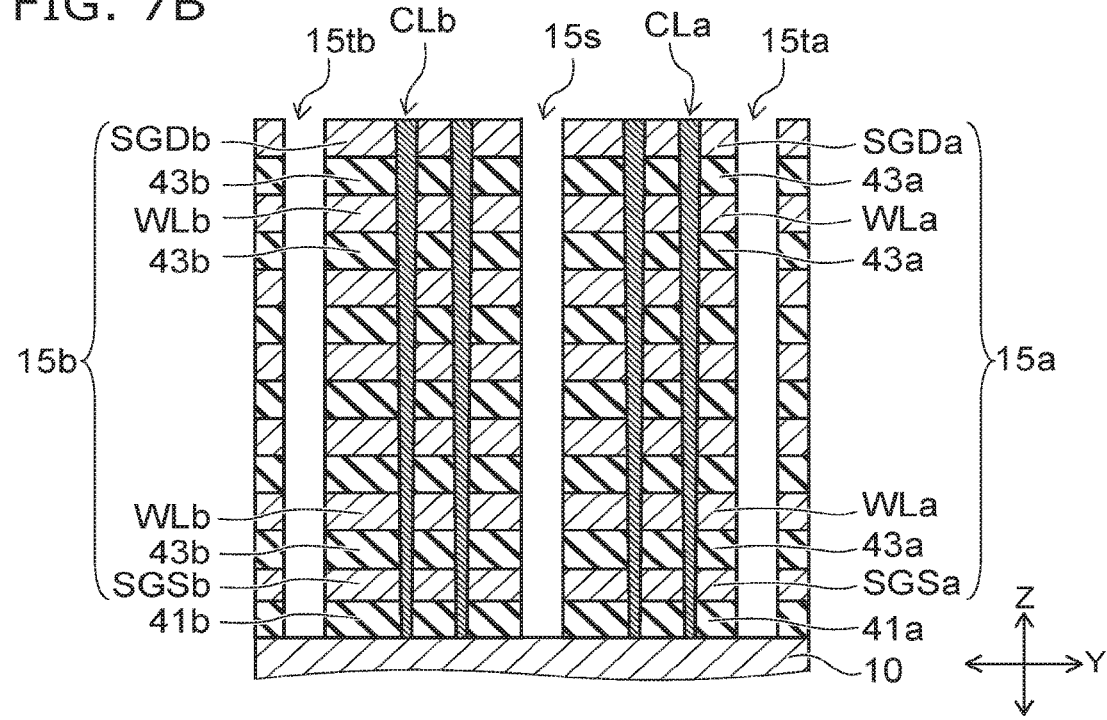

As shown in FIG. 7B, the electrode layers WL, the source-side select gate SGS, and the drain-side select gate SGD are formed in the space 42s. The source-side select gate SGS is formed in the lowermost layer of the stacked structure 15, and the drain-side select gate SGD is formed in the uppermost layer of the stacked structure 15.

As shown in FIG. 8A, an insulating film 55 poor in coverage is formed on the stacked bodies 15a, 15b. Thus, the upper part of each of the slits 15s, 15ta, and 15tb is blocked by the insulating film 55 in the state in which an air gap is provided in each of the slits 15s, 15ta, and 15tb.

Subsequently, the insulating film 55 formed on the slit 15s is removed. Thus, the upper part of the slit 15s is opened while the upper part of each of the slits 15ta, 15tb is blocked.

As shown in FIG. 8B, a film made of the same material as that of the second layers 43 is formed in the slit 15s. Thus, second layers 43a, 43b in the respective stacked bodies 15a, 15b are integrally formed via the film in the slit 15s.

Subsequently, the film and the insulating film 55 formed on the stacked structure 15 are removed. Thus, the upper part of each of the slits 15ta, 15tb is opened.

Figure 9A:
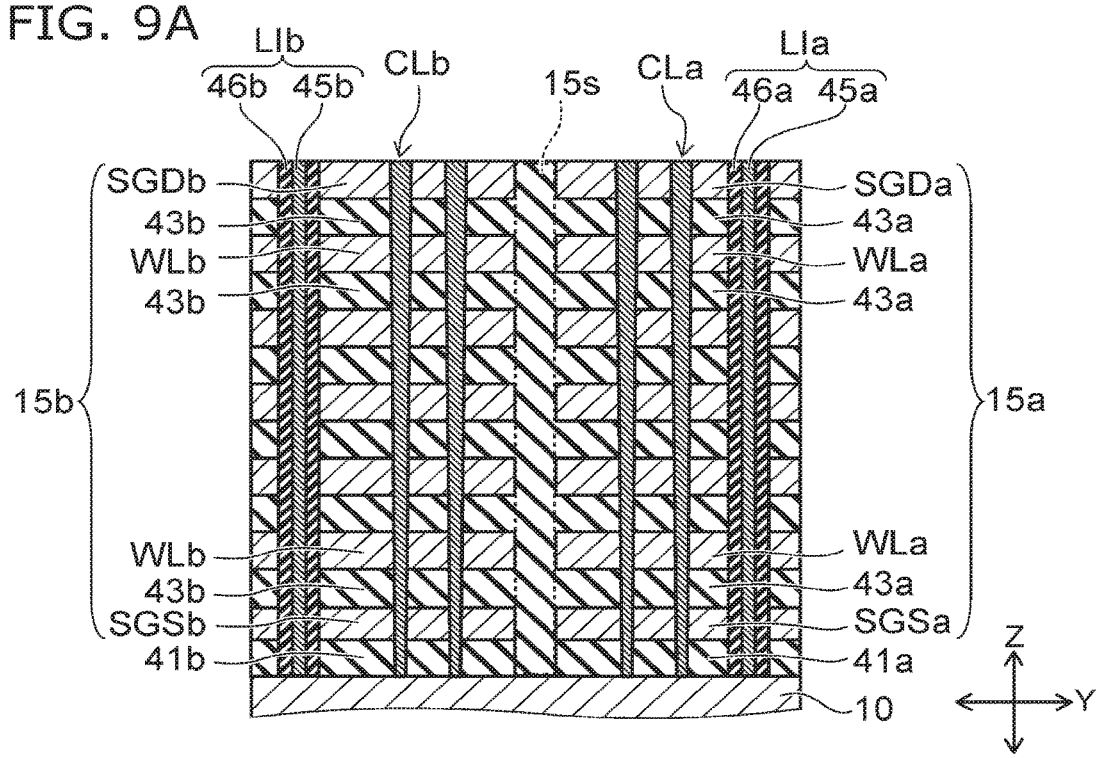

As shown in FIG. 9A, the insulating films 46a, 46b are formed on sidewalls of the slits 15ta, 15tb, respectively. The conductive films 45a, 45b are formed on the inner side of the insulating films 46a, 46b, respectively. Thus, the interconnect portions LIa, LIb are formed.

Subsequently, similarly to the example of the manufacturing method shown in FIG. 6B described above, the second layers 43a, 43b are removed through the slit 15s. Thus, a space formed integrally with the slit 15s is formed.

Subsequently, the insulating layer 44 poor in coverage is formed on the stacked bodies 15a, 15b and the slit 15s. Thus, the upper part of the slit 15s is blocked by the insulating layer 44 in the state in which an air gap is provided in the slit 15s. Thus, the insulating portions 61, 40a, and 40b are formed integrally.

Subsequently, by forming the contact portions Cc, Ci respectively on the columnar portions CL and the interconnect portions LI as shown in FIG. 3, and then forming the upper part interconnect and so on, the semiconductor memory device according to the embodiment is formed.

It should be noted that it is also possible to use the same material as that of the electrode layers WL as the material of the first layers 42 described above. In this case, the process of removing the first layers 42 is not performed. Further, it is also possible to form the insulating layer 44 on sidewalls of the slit 15s and sidewalls of the space before blocking the upper part of the slit 15s using the insulating layer 44. In this case, there are formed the insulating layers 40 each having the insulating film having contact with the electrode layers WL and the block insulating film 35 as shown in FIG. 2B.

Further, it is also possible to form the block insulating film 35 in the parts from which the first layers 42 are removed. In this case, the electrode layer WL is formed on the inner side of the block insulating film 35.

Figure 9B:
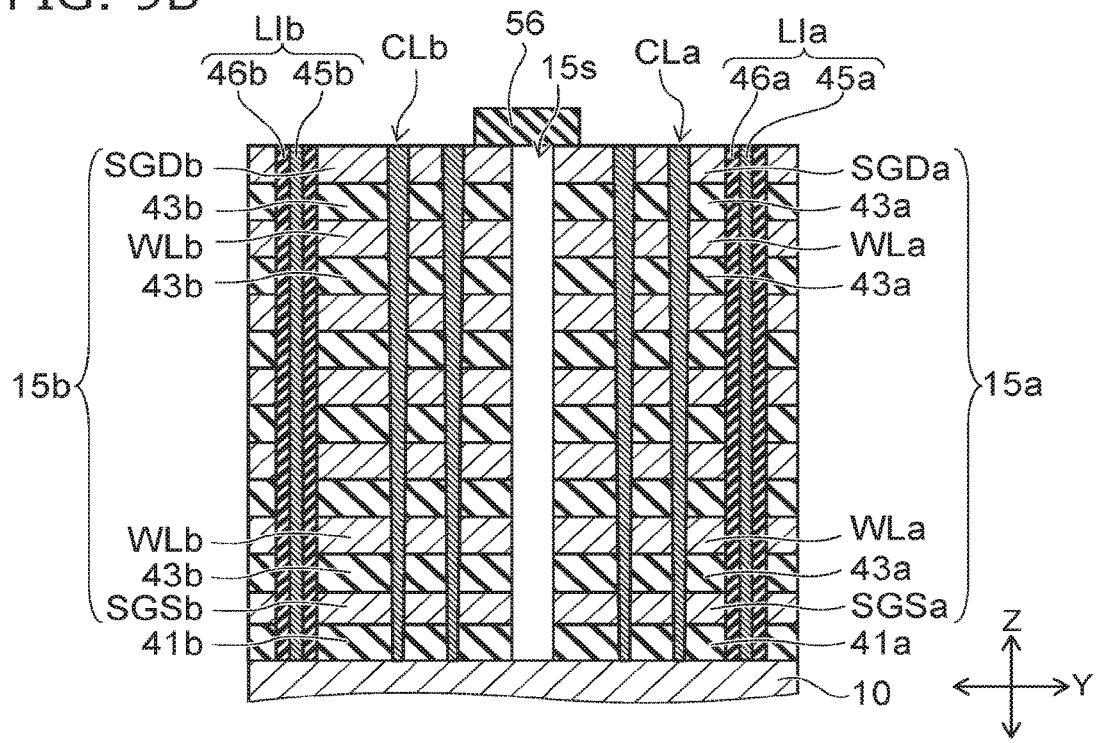

It should be noted that after forming the electrode layers WL, the source-side select gate SGS, and the drain-side select gate SGD shown in FIG. 7B, it is also possible to form an insulating film 56 poor in coverage on the slit 15s as shown in FIG. 9B.

In that case, the insulating films 46a, 46b are formed on the sidewalls of the slits 15ta, 15tb, respectively. The conductive films 45a, 45b are formed on the inner sides of the insulating films 46. Thus, the interconnect portions LIa, LIb are formed. Then, the insulating film 56 is removed. Thus, the slit 15s is opened.

Subsequently, similarly to the example of the manufacturing method shown in FIG. 6B described above, the second layers 43a, 43b are removed through the slit 15s. Thus, the space formed integrally with the slit 15s is formed.

Subsequently, the insulating layer 44 poor in coverage is formed on the stacked bodies 15a, 15b and the slit 15s. Thus, the upper part of the slit 15s is blocked by the insulating layer 44 in the state in which the air gap is provided in the slit 15s. Thus, the insulating portions 61, 40a, and 40b are formed integrally.

Subsequently, by forming the contact portions Cc, Ci respectively on the columnar portions CL and the interconnect portions LI as shown in FIG. 3, and then forming the upper part interconnect and so on, the semiconductor memory device according to the embodiment is formed.

An example of a layout of the semiconductor memory device according to the embodiment will be described with reference to FIG. 10A to FIG. 13.

Figure 10A:
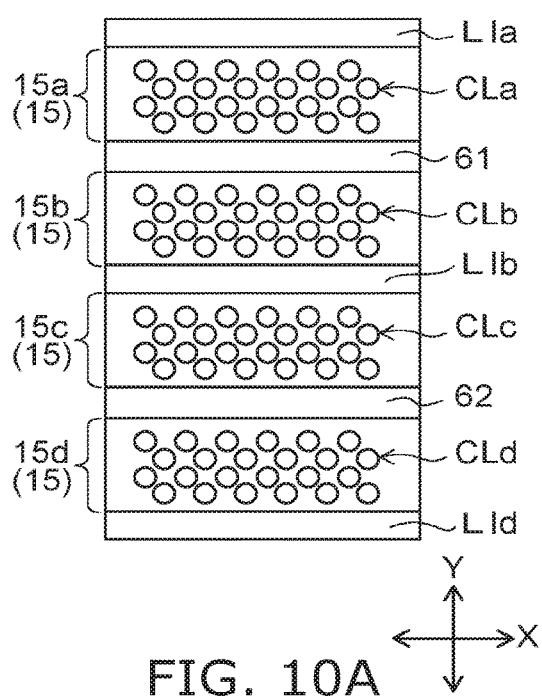
FIG. 10A to FIG. 10D are schematic plan views of a layout of the semiconductor memory device of the embodiment.
Figure 10B:
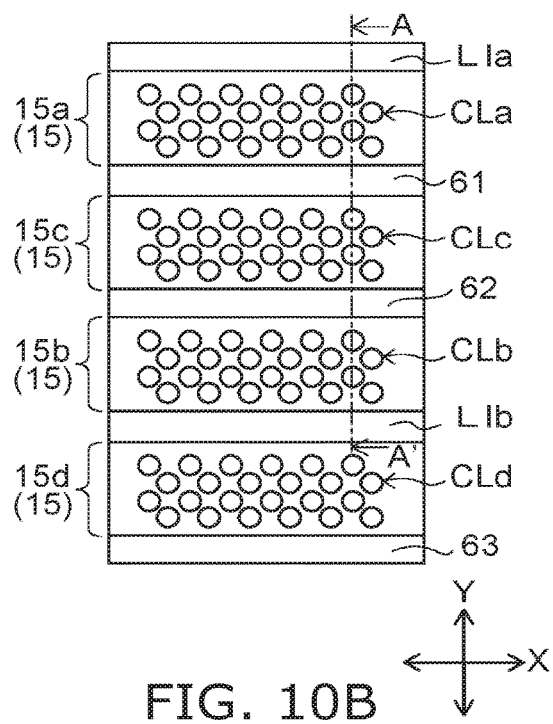
Figure 10C:
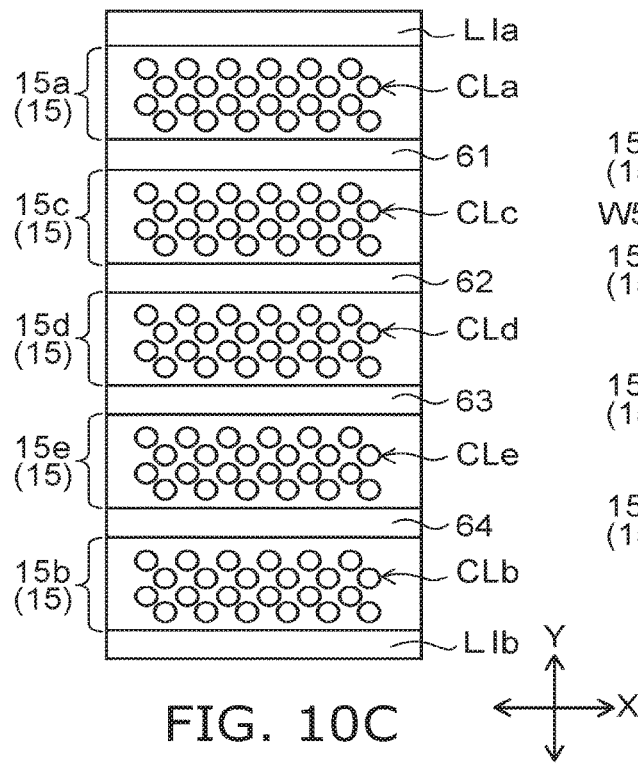
Figure 10D:
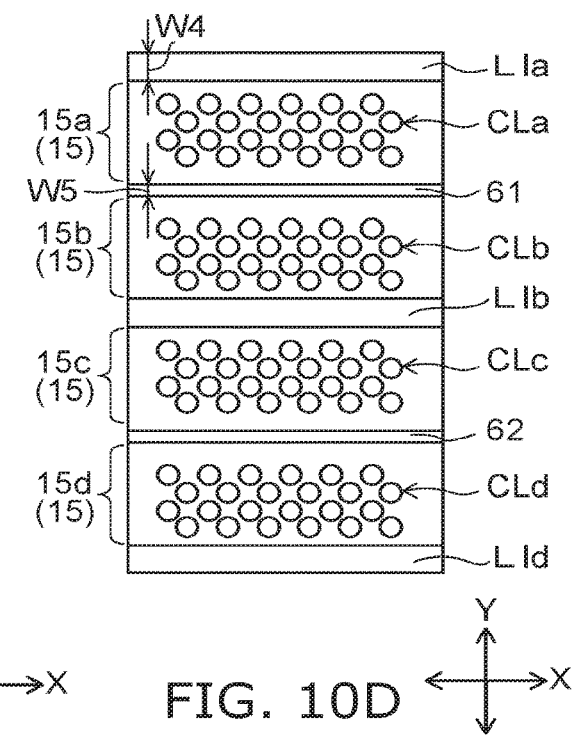
Figure 11:
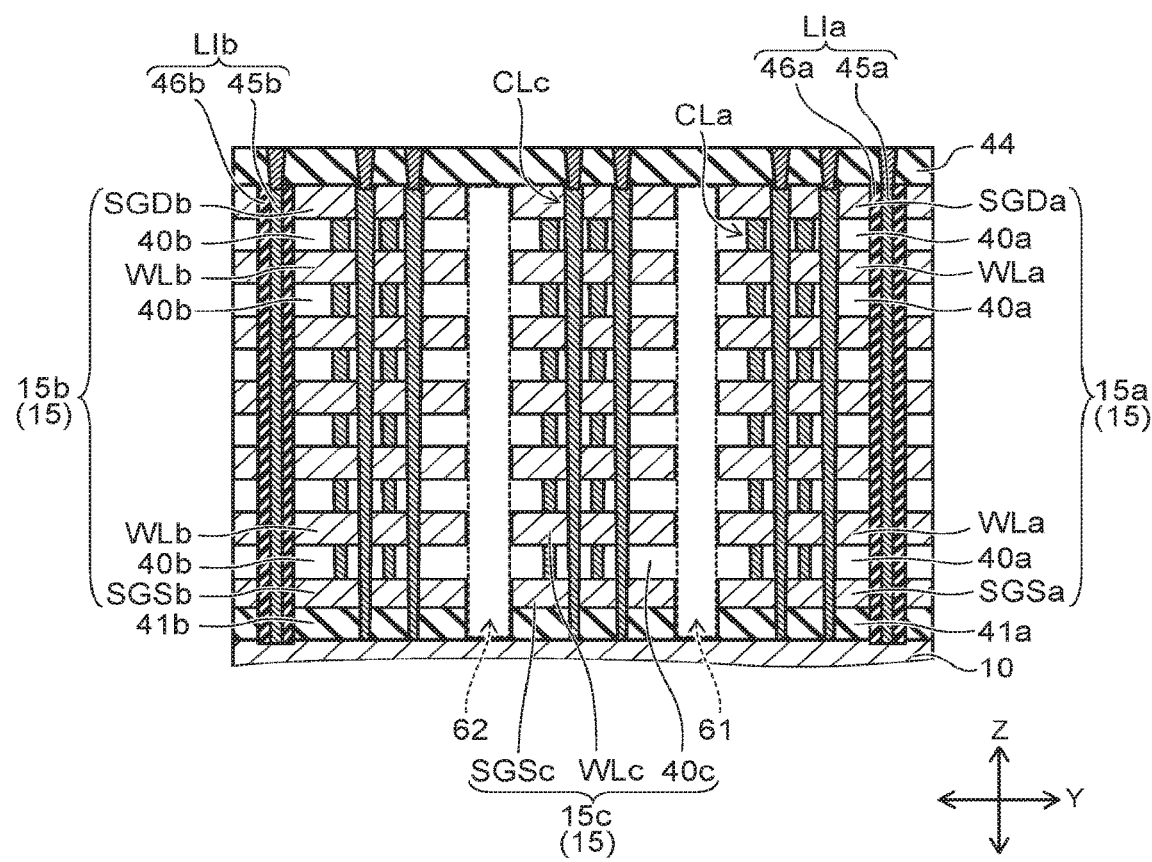
FIG. 11 is a schematic cross-sectional view of a part of the memory cell array of the embodiment.
Figure 12A:
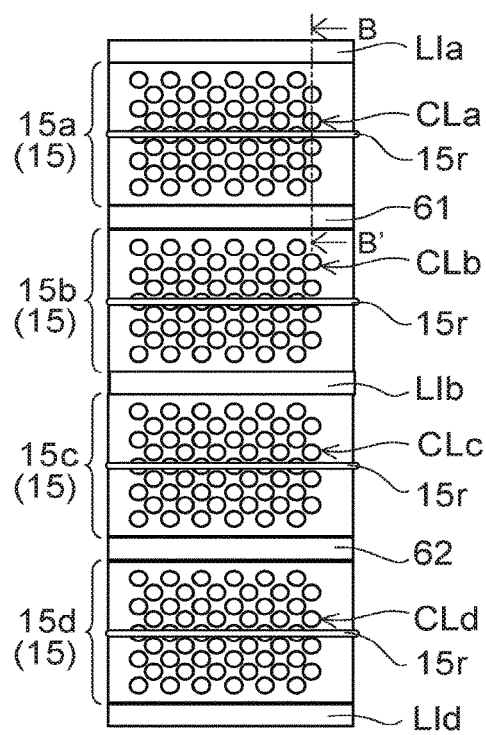
FIG. 12A and FIG. 12B are schematic plan views of a layout of the semiconductor memory device of the embodiment.
Figure 12B:
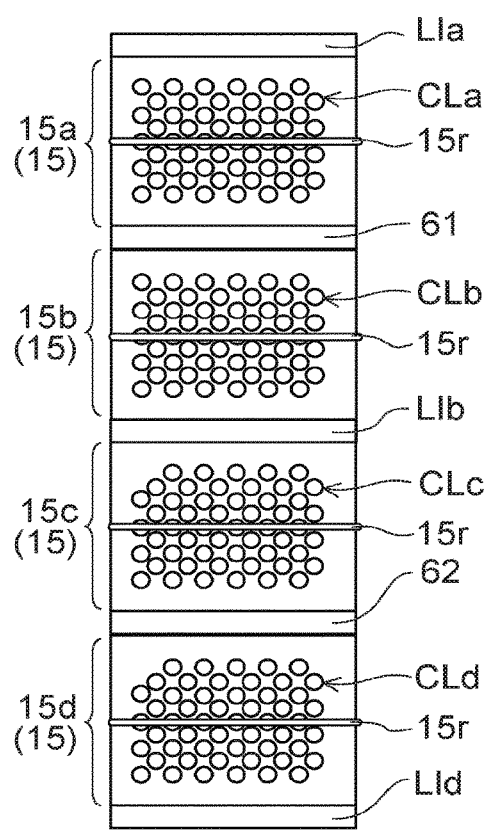
Figure 13:
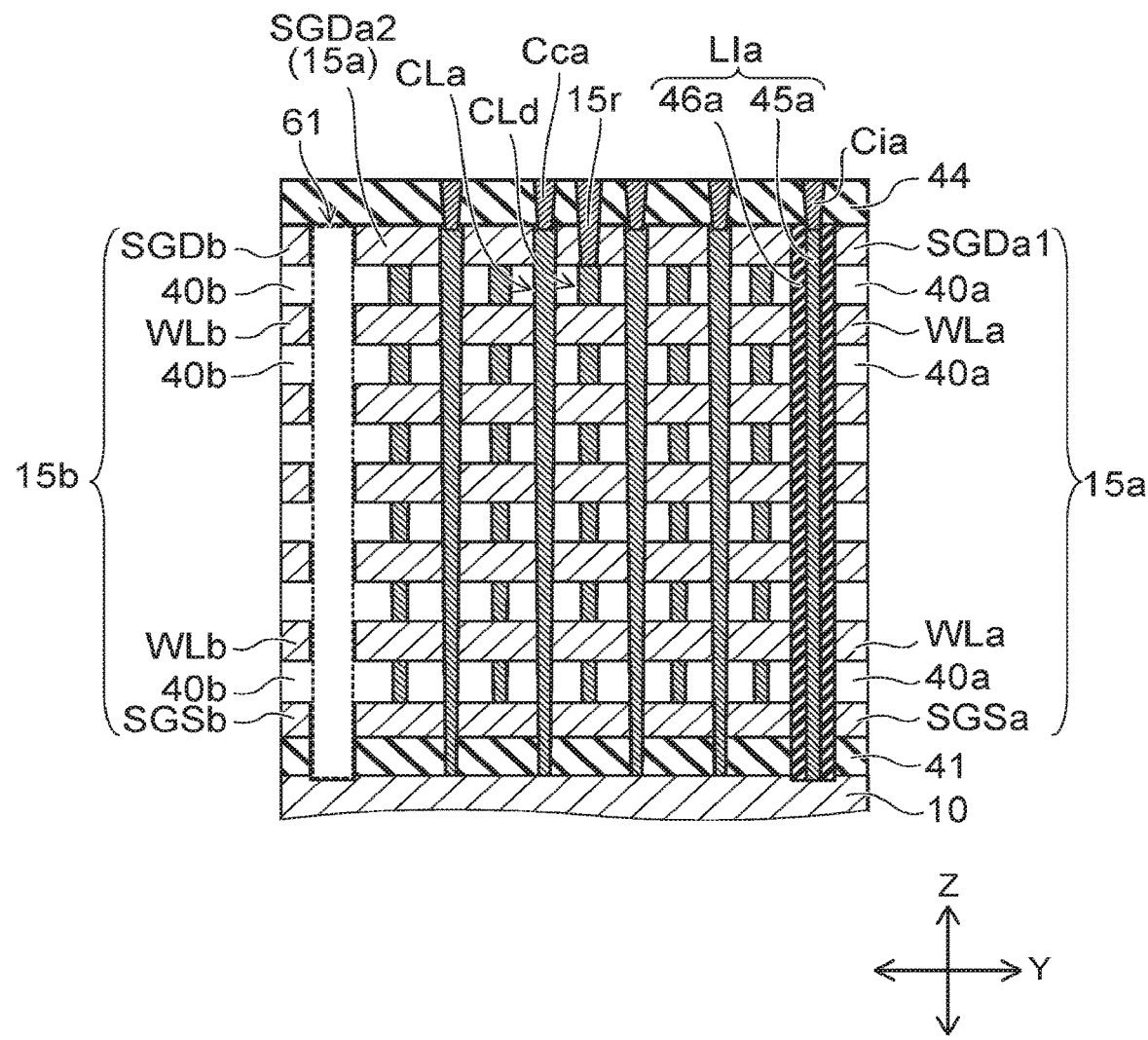
FIG. 13 is a schematic cross-sectional view of a part of the memory cell array of the embodiment.

FIG. 10A to FIG. 10D, FIG. 12A, and FIG. 12B show examples of a schematic plan view of a layout of the semiconductor memory device according to the embodiment, FIG. 11 is a schematic cross-sectional view corresponding to the line A-A' shown in FIG. 10B, and FIG. 13 is a schematic cross-sectional view corresponding to the line B-B' shown in FIG. 12A.

In FIG. 10A to FIG. 10D, the columnar portions CL are provided to form a fourfold staggered arrangement, and in FIG. 12A and FIG. 12B, the columnar portions CL are provided to form a ninefold staggered arrangement.

It should be noted that configurations of stacked bodies 15c to 15e, insulating portions 62 to 64, a interconnect portion LId, and columnar portions CLc to CLe are substantially the same as the configurations of the stacked bodies 15a, 15b, the insulating portion 61, the interconnect portions LIa, LIb, and the columnar portions CLa, CLb, respectively, and therefore, the description thereof will be omitted.

As shown in FIG. 10A, in the Y-direction, the interconnect portion LIa, the first stacked body 15a, the insulating portion 61, the second stacked body 15b, the interconnect portion LIb, the third stacked body 15c, the insulating portion 62, the fourth stacked body 15d, and the interconnect portion LId are provided in sequence.

In other words, the stacked bodies 15a to 15d are separately provided from each other in the Y-direction. The insulating portions 61, 62 and the interconnect portion LIb are respectively provided between the stacked bodies 15a to 15d.

The insulating portion 61 is provided between the first stacked body 15a and the second stacked body 15b. The insulating portion 61 is formed integrally with the insulating layers 40 in the first stacked body 15a and the second stacked body 15b.

The insulating portion 62 is provided between the third stacked body 15c and the fourth stacked body 15d. The insulating portion 62 is formed integrally with the insulating layers 40 in the third stacked body 15c and the fourth stacked body 15d.

The interconnect portion LIb is provided between the second stacked body 15b and the third stacked body 15c. The insulating layers 40 in the second stacked body 15b are separated from the insulating layers 40 in the third stacked body 15c.

In other words, the insulating layers 40 of each of the stacked bodies 15a to 15d are provided integrally with at least either of the insulating portions 61, 62.

As shown in FIG. 10B, in the Y-direction, the interconnect portion LIa, the first stacked body 15a, the insulating portion 61, the third stacked body 15c, the insulating portion 62, the second stacked body 15b, the interconnect portion LIb, the fourth stacked body 15d, and the insulating portion 63 are provided in sequence.

In other words, the stacked bodies 15a to 15d are separately provided from each other in the Y-direction. The insulating portions 61, 62 and the interconnect portion LIb are respectively provided between the stacked bodies 15*a* to 15*d*.

The insulating portion 61 is provided between the first stacked body 15*a* and the third stacked body 15*c*, and the insulating portion 62 is provided between the third stacked body 15*c* and the second stacked body 15*b*.

In other words, as shown in FIG. 11, the third stacked body 15*c* is provided between the insulating portions 61, 62. On this occasion, side surfaces in the Y-direction of electrode layers WLc in the third stacked body 15*c* are exposed to the insulating portion 61, 62, and do not have contact with the interconnect portion LI. The electrode layers WLc are supported by the columnar portions CLc.

The insulating portion 61 is formed integrally with the insulating layers 40 in the first stacked body 15*a*, the second stacked body 15*b*, and the third stacked body 15*c*, and the insulating portion 62.

The interconnect portion LIb is provided between the second stacked body 15*b* and the fourth stacked body 15*d*. The insulating layers 40 in the second stacked body 15*b* are separated from the insulating layers 40 in the fourth stacked body 15*d*.

The insulating portion 63 is formed integrally with the insulating layers 40 in the fourth stacked body 15*d*.

In other words, the insulating layers 40 of each of the stacked bodies 15*a* to 15*d* are provided integrally with at least either one of the insulating portions 61, 62, and 63.

As shown in FIG. 10C, in the Y-direction, the interconnect portion LIa, the first stacked body 15*a*, the insulating portion 61, the third stacked body 15*c*, the insulating portion 62, the fourth stacked body 15*d*, the insulating portion 63, a fifth stacked body 15*e*, the insulating portion 64, the second stacked body 15*b*, and the interconnect portion LIb are provided in sequence.

In other words, the stacked bodies 15*a* to 15*e* are separately provided from each other in the Y-direction. The insulating portions 61 to 64 are respectively provided between the stacked bodies 15*a* to 15*e*.

The insulating portion 61 is provided between the first stacked body 15*a* and the third stacked body 15*c*, the insulating portion 62 is provided between the third stacked body 15*c* and the fourth stacked body 15*d*, the insulating portion 63 is provided between the fourth stacked body 15*d* and the fifth stacked body 15*e*, and the insulating portion 64 is provided between the fifth stacked body 15*e* and the second stacked body 15*b*.

The insulating portion 61 is formed integrally with the insulating layers 40 in the stacked bodies 15*a* to 15*e* and the insulating portions 62 to 64. In other words, the insulating portions 61 to 64 sandwiched by the pair of interconnect portions LIa, LIb are formed integrally with the insulating layers 40 in the stacked bodies 15*a* to 15*e*. It should be noted that the number of the insulating portions and the stacked bodies sandwiched by the pair of interconnect portions is arbitrary.

As shown in FIG. 10D, in the Y-direction, a width W4 of the interconnect portion LIa is larger than a width W5 of the insulating portion 61. Also in this case, similarly to the layout shown in FIG. 10A, the insulating layers 40 of each of the stacked bodies 15*a* to 15*d* are provided integrally with at least either of the insulating portions 61, 62.

As shown in FIG. 12A, in the Y-direction, the interconnect portion LIa, the first stacked body 15*a*, the insulating portion 61, the second stacked body 15*b*, the interconnect portion LIb, the third stacked body 15*c*, the insulating portion 62, the fourth stacked body 15*d*, and the interconnect portion LId are provided in sequence. In other words, the disposition of the stacked bodies 15*a* to 15*d*, the interconnect portions LIa, LIb, and the insulating portions 61, 62 is substantially the same as the disposition shown in FIG. 10A. An insulating film 15*r* is provided in each of the stacked bodies 15*a* to 15*d*.

As shown in FIG. 13, the insulating film 15*r* is provided in the drain-side select gate SGD, and extends in the X-direction and the Z-direction. Drain-side select gates SGDa1, SGDa2 across the insulating film 15*r* from each other are separated from each other.

A bottom portion of the insulating film 15*r* is in contact with the dummy columnar portion CLd, which does not function as the memory cell. Therefore, the insulating film 15*r* does not extend to a part below the drain-side select gate SGD, and the first stacked body 15*a* is not separated in the Y-direction. Therefore, the insulating portion 61 is formed integrally with the insulating layers 40 provided between the interconnect portion LIa and the insulating portion 61.

In other words, the insulating layers 40 in each of the stacked bodies 15*a* to 15*d* shown in FIG. 12A are provided integrally with at least either of the insulating portions 61, 62.

As shown in FIG. 12B, the distance between each of the interconnect portions LIa, LIb, and LId and corresponding one of the insulating portions 61, 62 is longer than that in the layout shown in FIG. 12A. The configuration other than the above is substantially the same as shown in FIG. 12A, and the insulating layers 40 in each of the stacked bodies 15*a* to 15*d* are provided integrally with at least either of the insulating portions 61, 62.

It should be noted that it is also possible for the insulating film 15*r* to extend to, for example, the part below the drain-side select gate SGD. In that case, the two electrode layers WL opposed to each other via the insulating film 15*r* are electrically connected to a interconnect contact not shown with interconnect.

The effects of the embodiment will be described.

According to the embodiment, the first stacked body 15*a* is separated from the second stacked body 15*b*, and the insulating portion 61 is provided between the first stacked body 15*a* and the second stacked body 15*b*. Therefore, it is possible to remove the second layers 43 and to form the insulating layers 40 after forming the interconnect portion LI. Thus, it is possible to easily form the interconnect portion LI and the insulating layers 40.

For example, unlike the manufacturing method described above, the second layers 43 are removed through the slit 15*t* to form the insulating layers 40 in some cases. In this case, there is a possibility that the interconnect portion LI is formed not only in the slit 15*t*, but also in the insulating layers 40 when forming the interconnect portion LI. Thus, there is a possibility of causing degradations in the characteristics.

In contrast, according to the embodiment, by removing the second layers 43 through the slit 15*s*, and then forming the insulating portion 61 in the slit 15*s*, the interconnect portion LI is prevented from being formed in the insulating layers 40. Therefore, even in the case of forming the air gap in the insulating layers 40 due to the miniaturization of the three-dimensional device, it is possible to suppress the difficulty level of processing from rising.

Figure 14:
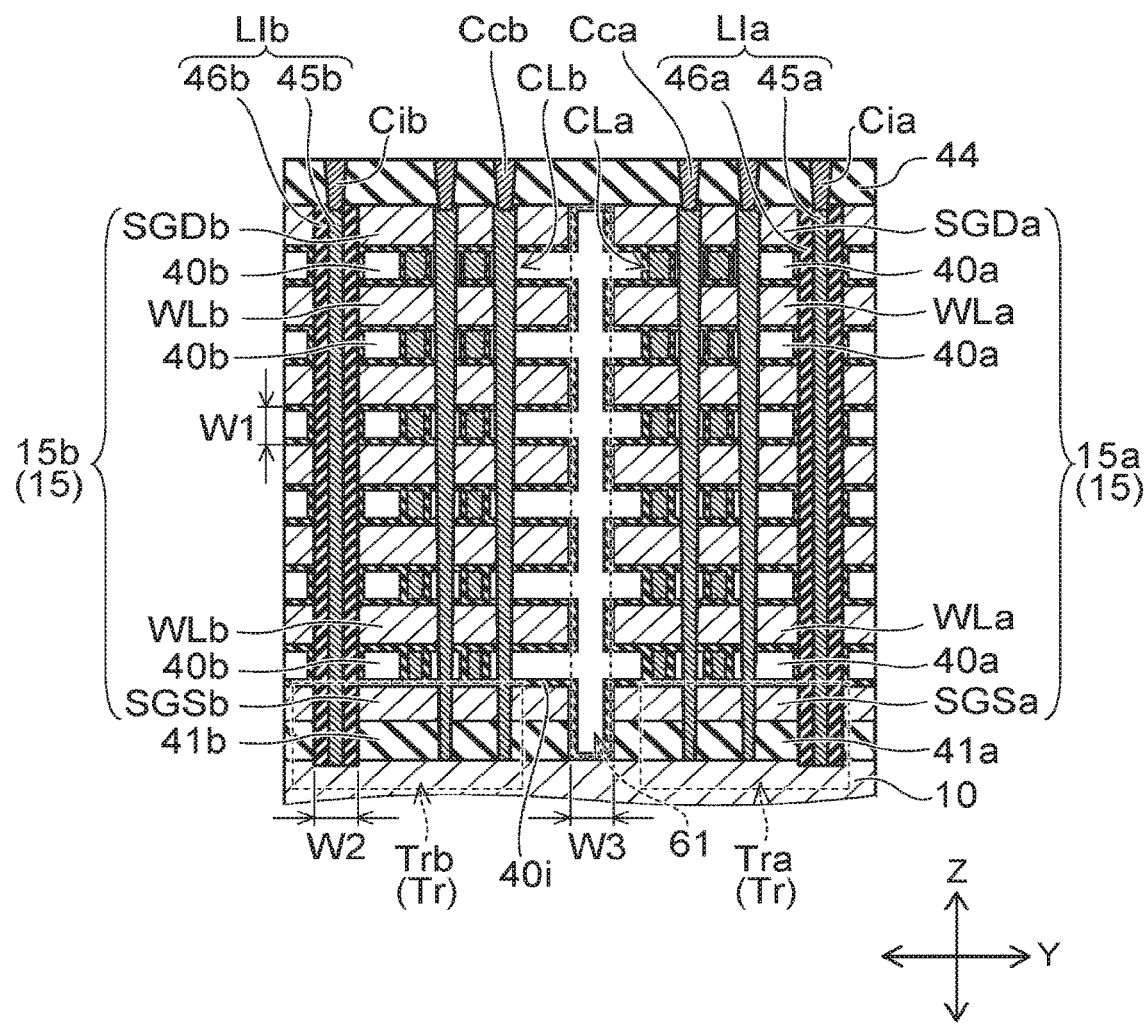
FIG. 14 is a schematic cross-sectional view of a part of the memory cell array of the embodiment.

Further, as shown in FIG. 2B and FIG. 14, the insulating layers 40 include, for example, the insulating films 40*i* being in contact with the electrode layers WL, the columnar portions CL and the block insulating film 35. For example, the insulating films 40*i* is provided between the air gap of the insulating layers 40 and the electrode layers WL, between the air gap of the insulating layers 40 and the columnar portions CL, and between the air gap of the insulating portion 61 and the electrode layers WL. Thus, the leakage current between the electrode layers WL can be reduced.

Further, the width W2 of the interconnect portion LI is not less than the width W3 of the insulating portion 61. Therefore, when forming the insulating layer 44 poor in coverage, it is possible to easily block the upper part of the slit 15s. Further, the thickness W1 of the insulating layers 40 is not more than the width W3 of the insulating portion 61. Therefore, it is possible to easily remove the second layers 43 through the slit 15s. Therefore, it is possible to easily form the air gap in the insulating portion 61.

Further, the columnar portions CL are provided in at least either of an area between the interconnect portion LI and the insulating portion 61 and an area between the insulating portion 61 and the insulating portion 62. Therefore, the insulating layers 40 are provided between the respective memory cells MC, and the dielectric constant of the insulating layers 40 is lower than the dielectric constant of the charge storage film 32 and of the silicon oxide film. Further, the insulating portion 61 is provided between drain-side select gates SGDa, SGDb. Thus, it is possible to realize reduction in parasitic capacitance, reduction in leakage current, an improvement in breakdown voltage, or the like. Hence, it is possible to suppress the difficulty level of processing due to the miniaturization of the three-dimensional device from rising to suppress the characteristics from degrading.

Further, the distance between the interconnect portion LI and the insulating portion 61 is arbitrary. In the case of, for example, increasing the distance between the interconnect portion LI and the insulating portion 61, the electrical resistance of the electrode layers WL can be decreased. In the case of, for example, decreasing the distance between the interconnect portion LI and the insulating portion 61, the miniaturization of the device can be promoted. In other words, regardless of the distance between the interconnect portion LI and the insulating portion 61, it is possible to suppress the difficulty level of processing from rising.

Figure 15:
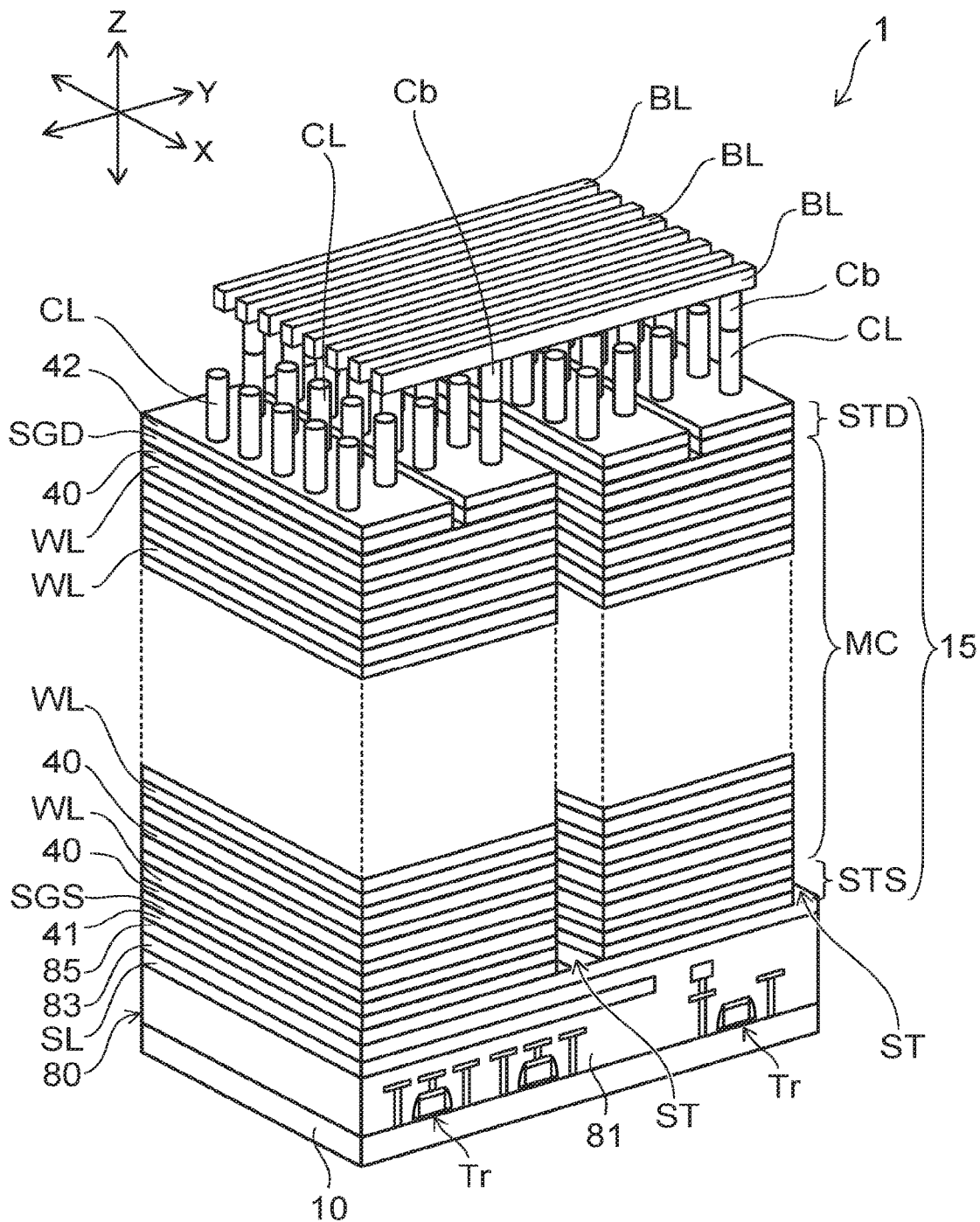
FIG. 15 is a schematic perspective view of the memory cell array of another embodiment.

FIG. 15 is a schematic perspective view of a semiconductor memory device of another embodiment.

As shown in FIG. 15, an insulating portion ST is provided in the stacked structure 15 and extends in the X-direction and the Z-direction inside the stacked structure 15. The insulating portion ST includes, for example, the interconnect portion LI. The layer 80, the source layer SL and semiconductor layer 85 may be provided between the substrate 10 and the stacked structure 15.

The layer 80 includes, for example, a control circuit including the transistor Tr and an interconnect not shown.

The semiconductor layer 85 is provided between the layer 80 and the stacked structure 15. The semiconductor layer 85 is, for example, contact with the columnar portion CL. The semiconductor layer 85 includes, for example, a conductive material. The conductive material may include, for example, a stacked body including silicon and metal silicide (for example, tungsten silicide).

The source layer SL is provided between the layer 80 and the semiconductor layer 85.

According to the another embodiment, it is possible to easily form the insulating portion ST and the insulating layer 40.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor memory device comprising:
   a first stacked body including a plurality of first electrode layers and a plurality of first insulating layers, the first electrode layers separately stacked on each other, the first insulating layers provided between the first electrode layers;
   a second stacked body including a plurality of second electrode layers and a plurality of second insulating layers, the second electrode layers separately stacked on each other, the second insulating layers provided between the second electrode layers, the second stacked body separated from the first stacked body in a first direction crossing a stacking direction of the first stacked body;
   a first insulating portion provided between the first stacked body and the second stacked body, the first insulating portion provided integrally to the first insulating layers and the second insulating layers;
   a first interconnect portion extending in the stacking direction and a second direction, the second direction crossing the stacking direction and the first direction; and
   a second interconnect portion extending in the stacking direction and the second direction,
   the first interconnect portion, the first stacked body, the first insulating portion, the second stacked body, and the second interconnect portion being provided in sequence in the first direction.

2. The device according to claim 1, wherein
   a dielectric constant of the first insulating portion, a dielectric constant of the first insulating layers, and a dielectric constant of the second insulating layers are lower than a dielectric constant of a silicon oxide film.

3. The device according to claim 1, wherein
   the first insulating layers, the second insulating layers, and the first insulating portion include an air gap.

4. The device according to claim 1, further comprising:
   a first semiconductor film provided in the first stacked body and extending in the stacking direction;
   a second semiconductor film provided in the second stacked body and extending in the stacking direction, and
   a conductive layer provided under the first stacked body and the second stacked body,
   wherein the first semiconductor film is electrically connected to a first transistor provided in the conductive layer, and
   the second semiconductor film is electrically connected to a second transistor provided in the conductive layer.

5. The device according to claim 4, wherein
   the first interconnect portion includes a first conductive film extending in the stacking direction and the second direction, the first conductive film electrically connected to the first semiconductor film via the first transistor, and
   the second interconnect portion includes a second conductive film extending in the stacking direction and the second direction, the second conductive film electrically connected to the second semiconductor film via the second transistor.

6. The device according to claim 1, wherein
in the first direction, a maximum width of a bottom surface of the first interconnect portion and a maximum width of a bottom surface of the second interconnect portion are not less than a maximum width of a bottom surface of the first insulating portion.

7. The device according to claim 1, wherein
a maximum thickness in the stacking direction of the first insulating layers and a maximum thickness in the stacking direction of the second insulating layers are not more than a maximum width in the first direction of a bottom surface of the first insulating portion.

8. The device according to claim 1, further comprising:
a fifth insulating layer integrally provided on the first stacked body and the second stacked body.

9. The device according to claim 1, wherein
a number of stacked layers of the first electrode layers is equal to a number of stacked layers of the second electrode layers.

10. The device according to claim 1, wherein
the first stacked body includes
a select gate provided on the first electrode layers and separated from the first electrode layers, and
an insulating film provided in the select gate, and extending in the stacking direction and a second direction, the second direction crossing the stacking direction and the first direction.

11. A semiconductor memory device comprising:
a first stacked body including a plurality of first electrode layers and a plurality of first insulating layers, the first electrode layers separately stacked on each other, the first insulating layers provided between the first electrode layers;
a second stacked body including a plurality of second electrode layers and a plurality of second insulating layers, the second electrode layers separately stacked on each other, the second insulating layers provided between the second electrode layers, the second stacked body separated from the first stacked body in a first direction crossing a stacking direction of the first stacked body;
a first insulating portion provided between the first stacked body and the second stacked body, the first insulating portion provided integrally to the first insulating layers and the second insulating layers;
a third stacked body including a plurality of third electrode layers and a plurality of third insulating layers, the third electrode layers separately stacked on each other, the third insulating layers provided between the third electrode layers;
a second insulating portion provided integrally to the first insulating layers, the second insulating layers, the third insulating layers, and the first insulating portion;
a fourth stacked body including a plurality of fourth electrode layers and a plurality of fourth insulating layers, the fourth electrode layers separately stacked on each other, the plurality of fourth insulating layers provided between the fourth electrode layers;
an interconnect portion extending in the stacking direction and a second direction, the second direction crossing the stacking direction and the first direction; and
a third insulating portion provided integrally to the fourth insulating layers, and separated from the second insulating layers, the first stacked body, the first insulating portion, the third stacked body, the second insulating portion, the second stacked body, the interconnect portion, the fourth stacked body, and the third insulating portion being provided in sequence in the first direction.

12. A semiconductor memory device comprising:
a first stacked body including a plurality of first electrode layers stacked via a first air gap;
a first interconnect portion arranged adjacently to the first stacked body in a first direction crossing a stacking direction of the first stacked body, the first interconnect portion including a first conductive film, the first conductive film extending in the stacking direction and a second direction, the second direction crossing the stacking direction and the first direction;
a first air gap portion provided farther from the first interconnect portion in the first direction than the first stacked body, the first insulating portion extending in the stacking direction and the second direction, the first air gap portion communicating with the first air gap; and
a first semiconductor film provided in the first stacked body and extending in the stacking direction.

13. The device according to claim 12, wherein
the first stacked body includes an insulating film provided between the first air gap and the first electrode layers, and between the first air gap portion and the first electrode layers.

14. The device according to claim 13, further comprising:
a second stacked body including a plurality of second electrode layers, the second electrode layers stacked via a second air gap,
wherein the second air gap is provided integrally to the first air gap and the first air gap portion.

15. The device according to claim 14, further comprising:
a third stacked body including a plurality of third electrode layers stacked via a third air gap; and
a second air gap portion communicating with the first air gap, the second air gap, the third air gap, and the first air gap portion,
wherein the first interconnect portion, the first stacked body, the first air gap, the third stacked body, the second air gap portion, and the second stacked body are provided in sequence in the first direction.

16. The device according to claim 14, further comprising:
a third stacked body including a plurality of third electrode layers stacked via a third air gap; and
a second interconnect portion including a second conductive film, the second conductive film extending in the stacking direction and the second direction,
wherein the first interconnect portion, the first stacked body, the first air gap portion, the second stacked body, the second interconnect portion, and the third stacked body are provided in sequence in the first direction, and
the second air gap is separated from the third air gap.

17. A method for manufacturing a semiconductor memory device, comprising:
forming a stacked body including a plurality of first layers and a plurality of second layers, the first layers separately stacked on each other, the second layers provided between the first layers;
forming a first hole and a second hole, the first hole and the second hole piercing the stacked body, the second hole separated from the first hole in a first direction, the first direction crossing a stacking direction of the stacked body;

forming a first insulating film on an inner wall of the first hole and on an inner wall of the second hole, the first insulating film including a charge storage film;

forming a semiconductor film on a side surface of the first insulating film;

forming a first slit and a second slit, the first slit and the second slit piercing the stacked body and extending in the stacking direction and in a second direction, the second direction crossing the stacked direction and the first direction, the first slit and the second slit sandwiching the first hole and the second hole;

forming a second insulating film on an inner wall of the first slit and an inner wall of the second slit;

forming a conductive film on a side surface of the second insulating film, the conductive film electrically connected to the semiconductor film;

forming a third slit piercing the stacked body between the first hole and the second hole, the third slit extending in the second direction;

removing the second layers through the third slit; and forming an insulating layer on the stacked body and the third slit.

18. The device according to claim 11, wherein a dielectric constant of the first insulating portion, a dielectric constant of the first insulating layers, and a dielectric constant of the second insulating layers are lower than a dielectric constant of a silicon oxide film.

19. The device according to claim 11, wherein the first insulating layers, the second insulating layers, and the first insulating portion include an air gap.

20. The device according to claim 11, wherein a maximum thickness in the stacking direction of the first insulating layers and a maximum thickness in the stacking direction of the second insulating layers are not more than a maximum width in the first direction of a bottom surface of the first insulating portion.

* * * * *